United States Patent [19]
Nishi et al.

[11] Patent Number: 5,272,501
[45] Date of Patent: Dec. 21, 1993

[54] PROJECTION EXPOSURE APPARATUS

[75] Inventors: Kenji Nishi, Kawasaki; Saburo Kamiya, Yokohama; Naomasa Shiraishi, Kawasaki, all of Japan

[73] Assignee: Nikon Corporation, Tokyo, Japan

[21] Appl. No.: 934,340

[22] Filed: Aug. 25, 1992

[30] Foreign Application Priority Data

| Aug. 28, 1991 | [JP] | Japan | 3-217087 |
| Nov. 26, 1991 | [JP] | Japan | 3-336260 |
| Jan. 28, 1992 | [JP] | Japan | 4-37232 |

[51] Int. Cl.$^5$ .............................. G03B 27/42
[52] U.S. Cl. .......................... 355/53; 355/43; 355/71; 356/401
[58] Field of Search ............... 355/71, 53, 43; 356/401; 250/548

[56] References Cited

U.S. PATENT DOCUMENTS

| 4,636,077 | 1/1987 | Nomura et al. | 356/356 |
| 4,739,373 | 4/1988 | Nishi et al. | 355/53 |
| 4,780,617 | 10/1988 | Umatate et al. | 250/548 |
| 4,936,665 | 6/1990 | Whitney | 350/451 |
| 5,004,348 | 4/1991 | Magome | 356/401 |
| 5,138,176 | 8/1992 | Nishi | 250/548 |
| 5,144,362 | 9/1992 | Kamon et al. | 355/53 |
| 5,148,214 | 9/1992 | Ohta et al. | 355/43 |
| 5,150,173 | 9/1992 | Isobe et al. | 356/401 |
| 5,184,196 | 2/1993 | Nakagawa et al. | 356/401 |

FOREIGN PATENT DOCUMENTS 1-140719 6/1989 Japan .

OTHER PUBLICATIONS

"Deep UV Wafer Stepper With Through the Lens Wafer to Reticle Alignment", SPIE vol. 1264, Optical/Laser Microlithography III (1990), pp. 534-547.
"New Imaging Technique for 64M-DRAM", SPIE vol. 1674, Optical/Laser Microlithography V (1992), pp. 741-752.

*Primary Examiner*—Richard A. Wintercorn
*Attorney, Agent, or Firm*—Shapiro and Shapiro

[57] ABSTRACT

A projection exposure apparatus having an irradiation optical system for irradiating a pattern formed on a mask with first irradiation light, a projection optical system for imaging and projecting the image of the pattern of the mask onto a photosensitive substrate, and a mark detection device for irradiating a predetermined mark formed on the photosensitive substrate with second irradiation light in a wavelength region which is different from that of the first irradiation light by the projection optical system and detecting light generated from the mark, the projection exposure apparatus including: a deflection member disposed on a pupil surface of the projection optical system or in a periphery in an adjacent plane of the same, shielding a beam, which is a portion of the first irradiation light generated from the mask and incident on the projection optical system, and which passes through the peripheral portion of the pupil surface of the projection optical system, deflecting the second irradiation light by a predetermined quantity and passing the deflected second irradiation light, wherein the mark detection device includes an irradiation system for emitting the second irradiation light to travel toward the deflection member.

23 Claims, 19 Drawing Sheets

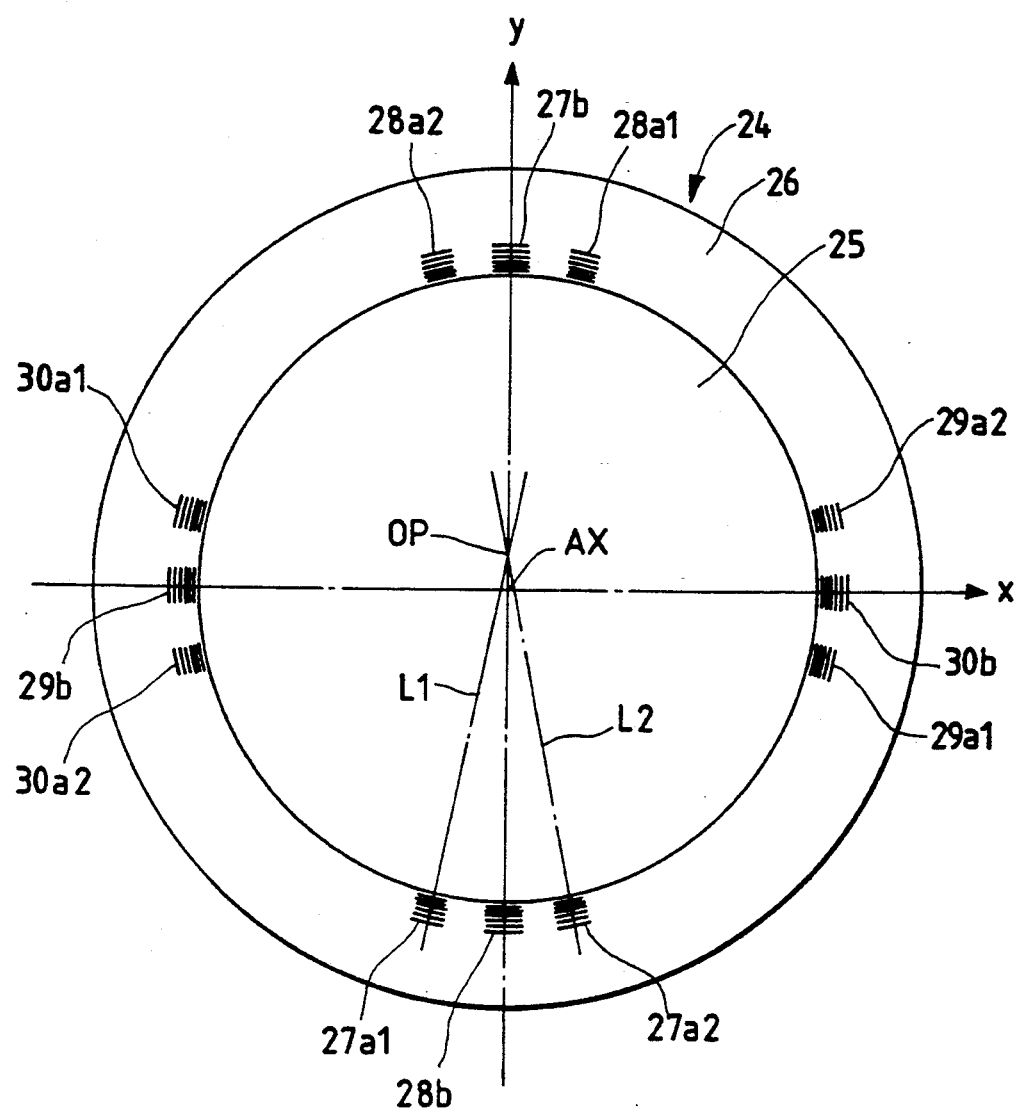

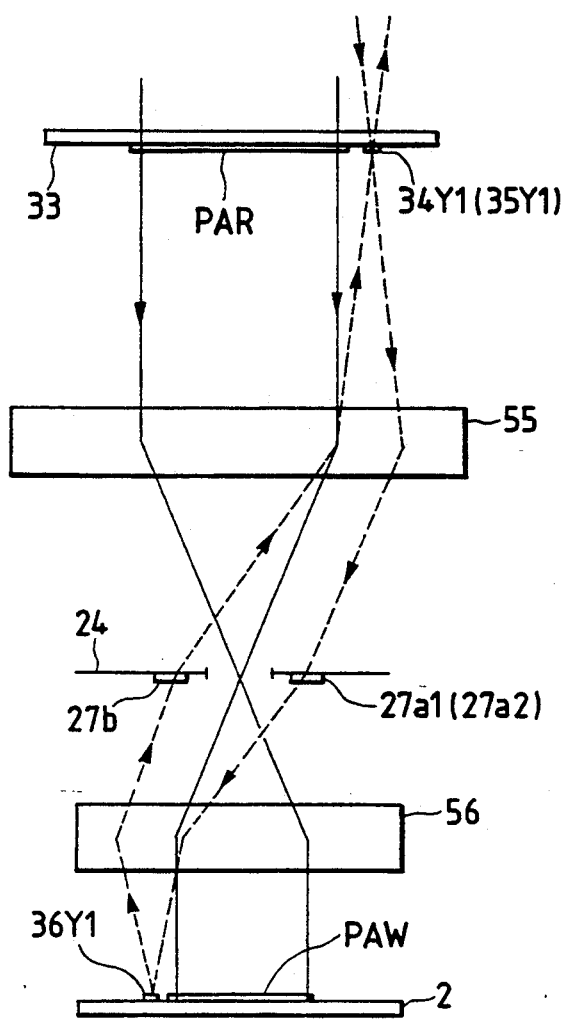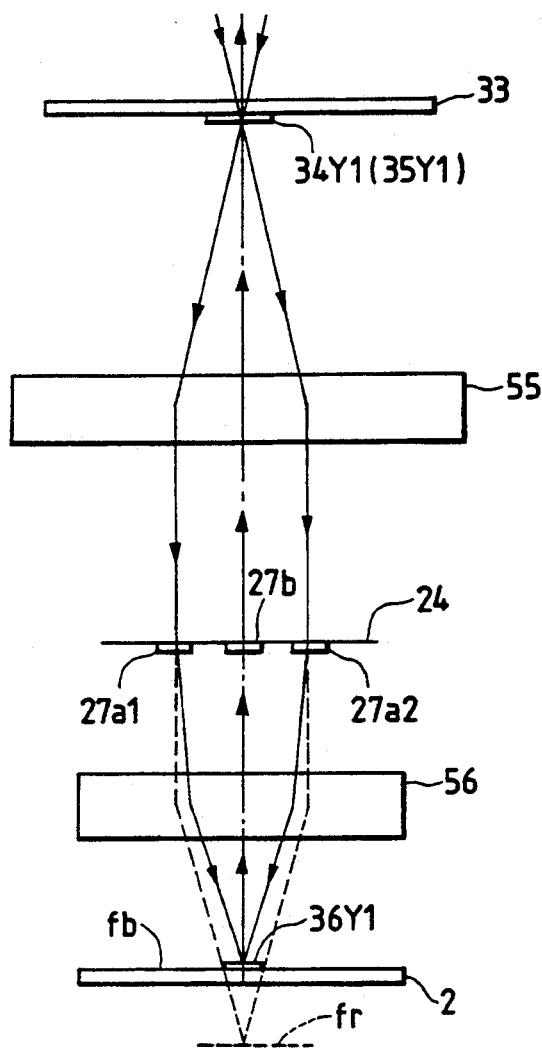

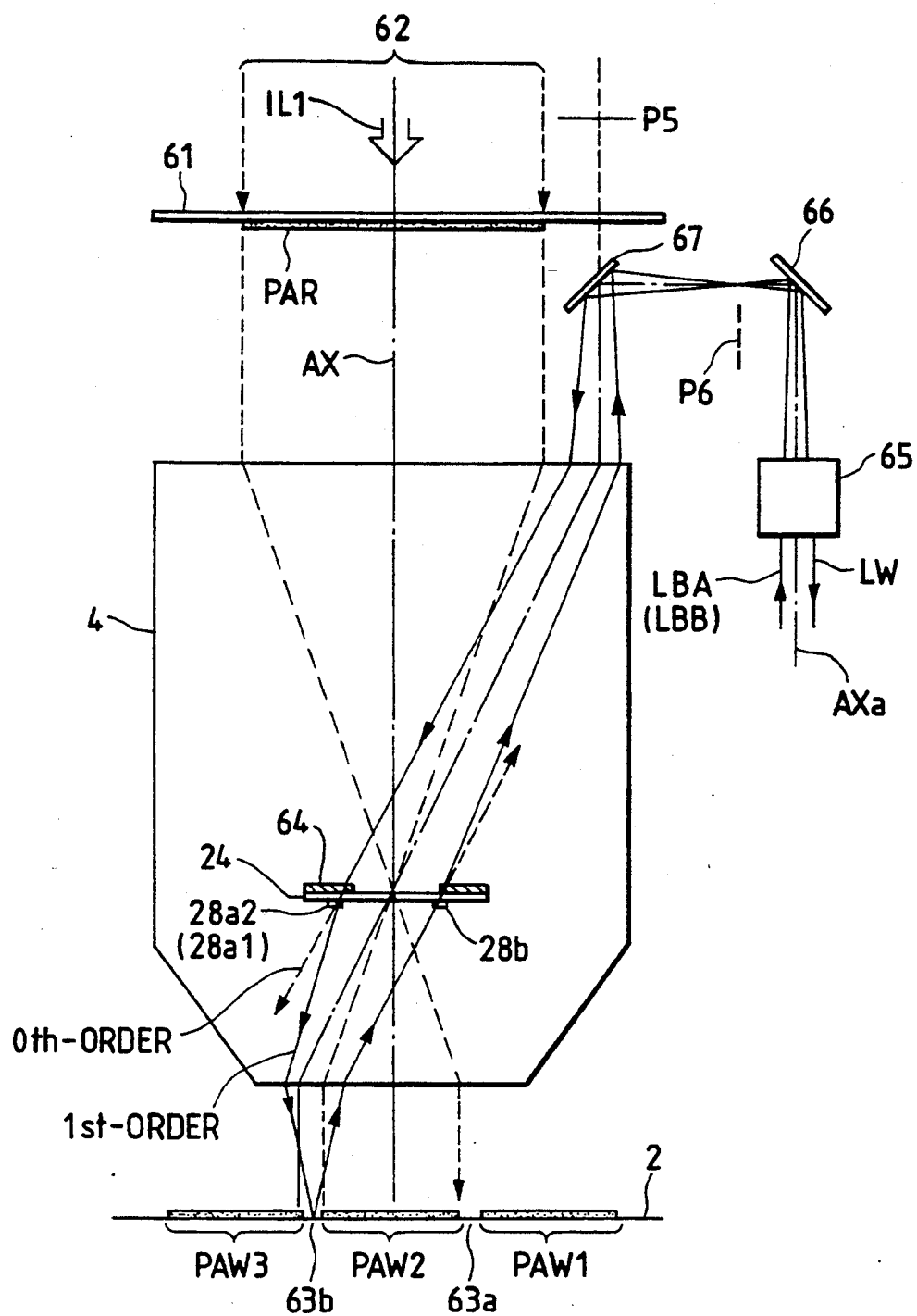

PROJECTION EXPOSURE APPARATUS

BACKGROUND OF THE INVENTION

1. Field of the Invention

The present invention relates to a projection exposure apparatus for use to manufacture semiconductor devices and the like.

2. Related Background Art

Recently, a step-and-repeat type contraction projection exposure apparatus (a stepper) has been, as an apparatus for transferring micropatterns at a high resolution, widely used in the lithography process of the semiconductor device manufacturing process In a stepper of the aforesaid type, the exposure and the transference operations are performed by using a projection optical system in such a manner that the patterns of masks or reticles (hereinafter called "reticles") are sequentially stacked on a plurality of shot regions (regions in which circuit patterns will be formed) disposed on a photosensitive substrate (semiconductor wafer sheets or glass plates having the surfaces on each of which a resist layer is formed) in the matrix configuration.

Therefore, the projected image of the reticle pattern must be accurately superposed (aligned) on the shot region. Hence, a variety of systems adaptable to the locating device (an alignment system) for accurately aligning the reticle patten and the wafer (the shot region) to each other have been disclosed as classified into two major types; an on access system and an off-access system.

The off-access system is a system arranged in such a manner that an alignment mark provided in the vicinity of the shot region is limitedly detected by the alignment system and then the wafer (a stage) is moved from the position of the alignment mark for a predetermined distance (the base line quantity) so that the reticle pattern is superposed on the shot region before exposure to light is) performed.

That is, the position at which the mark is detected by the alignment system and the position at which the reticle pattern is exposed to light by the projection optical system are different from each other.

Therefore, in the off-access system, the base line quantity can undesirably be varied due to heat or vibrations, causing a problem to arise in that the accurate superposition cannot be easily realized and, hence, the base line must be frequently measured, for example, whenever the wafer is exchanged in order to improve the superposition (alignment) accuracy.

On the contrary, the on-access system reveals an advantage in that the exposure can be performed in an accurately aligned state because the aforesaid mark detection position and the exposure position are the same.

As the alignment system adaptable to the on-access system, a so-called TTR (Through The Reticle) type alignment system has been available which is so arranged that an alignment mark (hereinafter called a "reticle mark") disposed in the vicinity of the reticle pattern and an alignment mark (wafer mark) on the wafer are detected by means of the projection optical system.

The disclosed alignment systems of the TTR type are mainly classified into the following two types:

One alignment system is arranged in such a manner that alignment irradiation light having substantially the same wavelength region as that of exposure light (i-rays, KrF eximar laser beams or the like) is used to irradiate the reticle mark and the wafer mark and the light reflected from the two marks are detected so that positions of the reticle and the wafer are aligned. In usual, the image of the reticle mark and that of the wafer mark are simultaneously detected by an image pickup device (such as a CCD camera) so that the relative deviation between the two marks is obtained.

Another alignment system is arranged in such a manner that alignment light (for example, He-Ne laser or the like) having a wavelength region which is different from that of exposure light is used. Since the chromatic aberration of the projection optical system can be generally satisfactorily corrected with respect to the exposure wavelength, the reticle and the wafer are aligned to each other by disposing a chromatic aberration correction optical system at a position between the reticle and the wafer.

FIG. 21 illustrates an example of the conventional projection type exposure device for performing the alignment operation by the TTR method. Referring to FIG. 21, a wafer 2 is placed on a wafer stage 1, and an alignment mark 3 is formed in the periphery of each shot region on the wafer 2. A pupil portion of a two-side telecentric projection optical system 4 secured above the wafer stage 1 has a diaphragm 5 fastened thereto, the diaphragm being disposed for the purpose of limiting the NA (Numerical Aperture) of projecting light with which the wafer 2 is irradiated. The wafer stage 1 is constituted in such a manner that it can be freely moved in parallel and rotated by a predetermined angular degree in a plane perpendicular to the optical axis of the projection optical system 4. The position of the wafer stage 1 is detected by a laser interference measuring machine comprising a movable mirror 6, which is disposed on the stage 1, and a detector 7 (although omitted from illustration two pairs each of which is composed of one movable mirror 6 and one detector 7 are provided).

A drive mechanism 8 moves and rotates the wafer stage 1. When rough alignment is performed, a control device 9 causes the drive mechanism 8 to move the wafer stage 1 so as to align the position detected by the laser interference measuring machine to a predetermined position. When a fine alignment is finally performed, an image signal processing circuit 10 supplies information about the position deviation of an alignment mark to be described later to the control device 9 so that the control device 9 locates the wafer stage 1 in such a manner that the aforesaid position deviation is limited in a predetermined range.

An exposure lighting system 11 generates irradiation light IL1 which has a wavelength region (for example, g-rays the wavelength of which is 436 nm, i-rays the wavelength of which is 365 nm or eximar laser beam the wavelength of which is 248 nm) which is intensely sensitive to a photosensitive material such as a photoresist present on the wafer 2. Illumination light IL1 is condensed by a condenser lens 12 so that the pattern region of a reticle 14 secured to a support member 13 is irradiated with condensed irradiation light. Light, which has passed through the reticle 14, is used to irradiate the wafer 2 by the projection optical system 4, so that the image of the pattern region of the reticle 14 is formed on the wafer 2.

Then, alignment is so performed that the deviation between the position of the image of the reticle 15 formed in the vicinity of the pattern region of the reticle 14 and that of the wafer mark 3 placed on the wafer 2 is included in a predetermined range.

A resist layer is formed on the surface of the wafer 2 in the exposure process and the wafer mark 3 is detected via the resist layer at the time of the alignment process. As the resist layer, use of a multilayer resist structure or the like capable of raising the absorption factor (lowering the transmission factor) with respect to exposure light has been considered in order to form a high resolution pattern. However, if the multilayer resist structure or the like is used, the use of light in a wavelength region, which is the same as that of exposure light, as irradiation light for alignment will raise a problem as follows: irradiation light for alignment can be excessively decayed before it reaches the wafer mark 3 on the wafer 2 and also light (regular reflection light, scattered light, diffracted light, and the like) reflected by the mark 3 is decayed, causing the problem to take place in that the mark 3 on the wafer 2 cannot be recognized by the alignment optical system with a sufficient light quantity.

It might therefore be considered feasible to employ light in a wavelength region which has a high transmission factor with respect to the photosensitive material such as the resist, for example, light in a wavelength region which is longer than the wavelength region of exposure light as irradiation light for alignment. Since the chromatic aberration of the projection optical system 4 is, at present, satisfactorily corrected with respect to only irradiation light for exposure in usual, the mark 15 on the reticle 14 and the mark 3 on the wafer 2 do not have a conjugate relationship with respect to the projection optical system 4 in a state where they are irradiated with irradiation light for exposure. Accordingly, a correction optical system for correcting the chromatic aberration is hitherto provided for the purpose of correcting the chromatic aberration of the projection optical system 4 with respect to alignment light so as to make the mark 3 and the mark 15 hold the conjugate relationship.

Then, an alignment optical system having a correction optical system of the aforesaid type will now be described. Referring to FIG. 21, irradiation light IL2 for alignment is supplied through an optical fiber bundle 16, illuminating light IL2 being then converted into substantially parallel light beams by a collimeter lens 17. The parallel light beams are converged on the mark 15 placed on the reticle 14 by a half mirror 18, an objective lens 19 and a mirror 20. Irradiation light, which has passed through the mark 15, is converged onto the mark 3 on the wafer 2 by a correction lens 21 for correcting the chromatic aberration and the projection optical system 4.

Light reflected from the mark 15 on the reticle 14 reversely passes through the optical path while passing the half mirror 18 before it is, by an image-forming lens 22, converged onto the surface on which a charge-coupled type image pickup device (CCD) 23 picks up an image. On the other hand, light reflected from the mark 3 on the wafer 2 is first imaged at a position of the mark 15 on the reticle 14, and then it reversely passes the optical path before it passes through the half mirror 18. Then, it is again imaged on the surface on which the CCD 23 picks up an image by the image-forming lens 22. If the marks 3 and 15 are respectively formed into slit-like patterns, a slit image 15I of the mark 15 on the reticle 14 and an image 31 of the mark 3 on the wafer further formed on the reticle 14 are formed on the surface on which the CCD 23 picks up an image. Information about the aforesaid images is, as picked-up image signal as shown in FIG. 23, supplied to an alignment device 10.

The image signal processing circuit 10 detects the position deviation between the midpoint of the image 15I and that of the image 31 so as to supply information about the deviation to the control device 9. The control device 9 locates the wafer stage 1 so as to cause the aforesaid position deviation to be included in a predetermined range. Incidentally, only one alignment optical system 1 is illustrated in FIG. 21 for the purpose of simplifying the description, four pairs of the alignment optical system, the alignment marks 3 and 15 are present for example. By performing the alignment by means of the alignment optical system, accurate alignment regarding of the parallel movement and rotation of the wafer stage 2 in the plane perpendicular to the optical axis of the projection optical system 4 can be performed.

A system which uses a diffraction grating has been known as a further accurate alignment system (see U.S. Pat. No. 5,004,348 for example). The aforesaid system uses alignment light in a wavelength zone which is different from the wavelength zone of exposure light so as to optically detect one-dimensional diffraction grating mark formed on the wafer or the reticle. In accordance with information of the pitch of the diffraction grating marks, the pitch-directional position of the wafer or the reticle is detected at high resolution. In an interference alignment method of the aforesaid type, a one-dimensional interference fringe is formed by simultaneously irradiating the diffraction grating mark with substantially parallel laser beams from two directions and refracted light generated from the diffraction grating mark due to the irradiation of the thus-formed interference fringe is photoelectrically detected, so that the position deviation of the diffraction grating mark is detected in accordance with the output signal denoting the result of the detection.

The interference fringe alignment method is classified into a heterodyne method in which the irradiation laser beams to be emitted from the two directions are given a predetermined frequency difference and a homodyne method in which the frequency difference is not given. In the homodyne method, stationary interference fringe is formed in parallel to the diffraction grating and therefore the diffraction grating on the wafer or the like must be slightly moved in the direction of the pitch of the grating at the time of performing the position detection. Hence, the position of the diffraction grating is obtained from the interference fringe for use as the standard. On the other hand, in the heterodyne method, the difference in the frequency (the beat frequency) between the two laser beams will cause the interference fringe to flow at high speed in the direction of its pitch at the beat frequency. Therefore, the position of the diffraction grating is obtained from the phase difference between a photoelectric signal obtained at the beat frequency and a reference signal.

However, the conventional projection-type exposure apparatus shown in FIG. 21 necessitates a fact that the mirror 20 and the correction 21 are inserted at the time of the alignment process and the mirror 20 and the correction lens 21 are moved outside the region through which exposure light passes at the time of the exposure process. Therefore, there arises a problem in that the alignment accuracy gradually deteriorates because the position of the optical system is gradually deviated due to the repetition of the forward/rearward movement of the optical system. What is worse, the aforesaid forward/rearward movement of the optical system takes a considerably long time, causing an excessively long time takes to transfer the pattern of the reticle 14 onto the wafer 2 by the step-and-repeat manner. As a result, a problem arises in that the number (the throughput) of wafer sheets which can be transferred and exposed per unit time decreases.

Referring to FIG. 21, the mark 15 on the reticle 14 and the mark 3 on the wafer 2 hold a conjugate relationship when they are irradiated with exposure light. Therefore, the resist layer covering the mark 3 on the wafer 2 is exposed with irradiation light which has passed through the mark 15 on the reticle 14 at the time of the exposure process, causing another problem to arise in that the mark 3 is broken due to development. Although the mark 3 can be again printed because the breakage of the mark 3 is not a critical problem, a problem arises in that a wide mark region must be formed on the wafer 2. If the mark 15 on the reticle 4 is moved away from the pattern region in order to prevent the aforesaid fact, the mark 3 on the wafer 2 must also be moved away from the pattern region in proportion to the aforesaid movement.

However, in a case where the transference and exposure are repeated by, for example, the step-and-repeat method, the alignment mark 3 is formed in a street line region which is an intermediate region between the adjacent shot regions on the wafer 2. However, if the mark 15 on the reticle 14 is moved away from the pattern region, the street region must have a wide area. In a case where the area of street line region is widened, a problem arises in that the shot configuration density on the wafer 2 (the number of the shot regions decreases) is lowered.

With regard to this, Japanese Patent Laid-Open No. 1-140719 has disclosed a projection exposure apparatus so arranged that a fresnel zone plate which serves as a lens with respect to only alignment light and which does not affect exposure irradiation light is used in place of the correction lens 21 shown in FIG. 21. Also in this case, a beam bender corresponding to the mirror 20 shown in FIG. 21 is used. Therefore, the aforesaid problem that an excessively long time takes to perform the transference and the exposure cannot be overcome because there is a necessity of moving forward/rearward the bender. What is worse, a problem arise in that the image forming characteristics at the time of the exposure somewhat deteriorate because exposure light passes through the fresnel zone plate.

As a projection-type exposure apparatus so arranged that the diffraction grating mark serving as the alignment mark is detected by the interference fringe alignment method, a projection-type exposure apparatus has been disclosed in Ser. No. 624, 534 (filed on Dec. 10, 1990 now abandoned). According to this disclosure, a dichroic mirror and a dual focal point device or the like are used for example so that the alignment can be performed at all times and as well as the irradiation of the alignment mark on the wafer with irradiation light for exposure is prevented. However, since the aforesaid arrangement is also arranged in such a manner that the alignment mark on the reticle and the alignment mark on the wafer hold the substantially conjugate relationship, the alignment mark on the wafer cannot be allowed to satisfactorily come closer to the shot region.

Another method has been suggested which is arranged in such a manner that a lens for correcting the chromatic aberration of the alignment beam is, in place of the fresnel zone plate, added to a local region in the projection optical system so as to simultaneously measure the reticle mark and the wafer mark (for example, see DEEP VV WAFER STEPPER WITH THROUGH THE LENS WAFER TO RETICLE ALIGNMENT, SPIE vol. 1264, Optical/Laser Microlithography 3 (1990)).

In connection with this, an optical member to be disposed in the projection optical system may be a diffraction grating disposed locally in place of the small lens, resulting in a similar effect to be obtained. If the small lens is used, light beams for exposure are refracted as well as the alignment light beams, causing the image forming characteristics to deteriorate. However, the use of the diffraction grating will prevent the deterioration.

If a phase-difference type diffraction grating is used, the diffraction grating can be so formed that only alignment light is diffracted but exposure light having different wavelength from that of alignment light is not diffracted by controlling the phase difference quantity (that is, controlling the thickness of the phase material).

By using an optical member of the type for correcting the chromatic aberration with respect to the light beams for alignment, the reticle mark and the wafer mark can be simultaneously measured and therefore the alignment accuracy of the projection exposure apparatus can be improved.

FIG. 24 illustrates an image forming relationship in a case where the diffraction grating is, as the optical member for correcting the chromatic aberration, disposed in a projection optical system. Referring to FIG. 24, two diffraction gratings 90a and 90b are disposed adjacent to the pupil surface of the projection optical system 4 at positions relatively away from the optical axis. Although FIG. 24 illustrates due to the convenience that the diffraction gratings 90a and 90b are positioned on a plane running parallel to the surface of the drawing sheet, they are disposed on a plane perpendicular to the optical axis of the projection optical system 4.

Exposure light Le emitted from one point of a surface, on which the pattern of the reticle 14 is formed, is converged onto a point (conjugate point) on the wafer 2 by the projection optical system 4. However, 0-order light La0 among alignment light Lai emitted from one point on the surface, on which the pattern of the reticle 14 is formed, which as it is passes through the diffraction gratings 90a and 90b is converged to, for example, a point on a plane below the wafer 2 due to the chromatic aberration of the projection optical system 4. In other words, if the diffraction gratings 90a and 90b are not present, the image of the wafer mark of the wafer 2 is not formed by the projection optical system 4 under alignment light on the surface on which the pattern of the reticle 14 is formed. Therefore, in a case where observation systems (which correspond to elements 19, 22 and 23 shown in FIG. 21) for observing the reticle mark and the wafer mark are present above the reticle 14, the image of the reticle mark and that of the wafer mark cannot be simultaneously observed on a common image pickup surface by using common alignment light.

In another case where the diffraction gratings 90a and 90b are disposed, 1-order diffraction light Lal due to the diffraction grating 90a and 90b among alignment light Lai emitted from one point of the reticle 14 is converged to a point (a conjugate point under exposure light) on the wafer 2. On the contrary, 1-order diffraction light due to the diffraction gratings 90a and 90b among alignment light reflected from one point on the wafer 2 is converged to a point on the reticle 14. That is, the presence of the diffraction gratings 90a and 90b causes the surface on which the pattern of the reticle 14 will be formed and the exposure surface of the wafer 2 to hold the conjugate relationship. If a predetermined phase gratings are used as the diffraction gratings 90a and 90b, only the intensity of 1-order light Lal can be raised while making the intensity of 0-order light to be substantially zero. Therefore, the loss of alignment light can be reduced to a quantity which can be substantially ignored.

Hence, in the case where the diffraction gratings 90a and 90b are present, the image of the reticle mark formed by alignment light reflected by the reticle mark on a surface of the reticle 14 on which the pattern is formed and the image of the wafer mark due to alignment light reflected from the wafer mark after it has passed through the reticle mark and is used to irradiate the wafer mark on the wafer 21 by the projection optical system 4 are formed on the same image pickup surface in an observation system above the reticle 14. Therefore, the positional relationship between the reticle mark and the wafer mark can be simultaneously and accurately measured.

However, in a case where the optical member for correcting the chromatic aberration is used as described above, a problem arises in that the optical members (the diffraction gratings 90a and 90b in a case shown in FIG. 24) for chromatic aberration correction for alignment light in the projection optical system are irradiated with exposure light and therefore the optical members are heated, deformed and broken. In particular, if the exposure light source is a pulse light source for eximar laser or the like, the energy density per unit time is raised excessively and therefore the probability of the breakage or the like of the optical member can be raised.

In a case where a light source such as a mercury lamp is used as the exposure light source which is continuously operated in terms of time, the probability of the breakage of the optical member for correcting the chromatic aberration can be lowered. However, the aforesaid optical member is heated due to its absorption of a portion of exposure light and the heat is transmitted to another image forming optical member, causing the other optical member to be deformed with heat or to have its refraction factor changed. As a result, a problem arises in that the image forming characteristics deteriorate. The aforesaid problem, of course, takes place in a case where the eximar laser light source is used as the exposure light source. Accordingly, use of a lighting optical system having a large $\sigma$ value (for example, $\sigma = 0.8$) which is a value indicating the coherency of illuminating light has been studied with the recent advance of the resist technology.

In order to overcome the aforesaid problem, it is necessary for the optical member for correcting the chromatic aberration to be disposed in the periphery of a optically Fourier-transformed plane with respect to the reticle pattern surface in the projection optical system under exposure light. Since the $\sigma$ value of the illuminating beam is 0.3 to 0.6 in an ordinary projection exposure apparatus, the distribution of irradiation light (exposure light) in the aforesaid plane is limited to the vicinity of the central portion of a circular plane and therefore it does not present in the periphery. Furthermore, although light diffracted by the reticle pattern reaches, its intensity is weak in comparison to that of rectilinear propagation light. In addition, the intensity is further weakened because diffraction light scatters in all directions due to the mixture of various pitch and direction patterns in the reticle pattern. Therefore, energy capable of breaking the optical member for correcting the chromatic aberration cannot be obtained. Furthermore, the calorific value is sufficiently limited.

However, by virtue of the improvement in the resolution and the depth of focus of the projection optical system, a technology capable of varying the shape of the irradiation light source has been reported. In an irradiation system of the aforesaid type, the light quantity distribution is not concentrated to the central portion in the plane corresponding to the Fourier-transformed plane but the same is concentrated to a specific position in the periphery. Furthermore, the concentration portion can be shifted in accordance with the reticle pattern. If the aforesaid irradiation technology is put into practical use, the position of the exposure beam which passes through the projection optical system is also changed in accordance with the change in the shape of the irradiation light source. Therefore, an improvement must be so realized that, even if the position of the irradiation light source is changed, the optical member for correcting the chromatic aberration in the projection optical system is not irradiated with irradiation light (exposure light).

Incidentally, the aforesaid technology has been disclosed in, for example, SPIE 1974-63 "New Imaging Technique for 64M DRAM" published in 1992.

Incidentally, since it is difficult for the alignment optical system which uses irradiation light having the wavelength in a region which is the same as that of exposure light to simultaneously perform the exposure operation and the alignment position at each exposure step, the alignment by using alignment light is performed prior to starting the exposure.

The reason for this lies in that the irradiation light quantity of the projection optical system cannot be considerably reduced in a case where a consideration is made about a system for, by using a half mirror, branching irradiation light (KrF eximar laser or the like) emitted from one irradiation light source into the irradiation system (hereinafter called a "main irradiation system) and the alignment optical system of the projection optical system, and therefore the branching ratio realized by the half mirror must be mainly distributed to the main irradiation system causing the light quantity of the alignment optical system to become too small if the exposure operation and the alignment operation are performed simultaneously by using the same light source.

In a case where a portion of irradiation light with which the reticle pattern is irradiated is shielded by the alignment optical system, the alignment optical system or a portion of the same must be moved outside the irradiation region at the time of exposing the pattern to light. Therefore, the position deviation between the reticle and the wafer cannot, of course, be detected during the exposure process.

Incidentally, it is ordinarily arranged that the position of the stage (the wafer stage), on which the wafer (the substrate) is placed, is detected by a laser interference meter at an excellent accuracy by means of a feedback control method which uses a closed loop. However, there arises a problem in that fluctuation is superposed on the detection signal obtained by the laser interference meter due to change in the refraction factor of air due to fluctuation. As a result, even if the wafer stage is located to a position, fluctuation takes place relative to the aforesaid point due to the fluctuation.

The amplitude of the fluctuation becomes larger in inverse proportion to the frequency and the fluctuation actually takes place in a range about ±0.03 μm while taking the response of the stage into consideration. Hence, a problem takes place in that even if the reticle and the wafer are correctly aligned to each other prior to starting the exposure process, the accuracy deterioration cannot be prevented if the alignment operation is not always performed during the exposure process.

If irradiation light having a wavelength which is different from that of exposure light is used on the contrary, the system capable of performing the alignment operation during the exposure operation can be constituted as described above. However, various limits present in the optical system for correcting the chromatic aberration and disposed between the reticle and the wafer causes a problem to take place in that the chromatic aberration (the chromatic aberration on the axis and the chromatic aberration of the magnification) cannot be completely corrected over the all beams and therefore the offset error can easily be generated.

SUMMARY OF THE INVENTION

Accordingly, a first object of the present invention is to provide a projection exposure apparatus capable of always performing accurate alignment while preventing deformation or the like of an projection image of a mask pattern. It is also an object to enable the shot configuration density to be raised by allowing the alignment mark on a photosensitive substrate to come closer to the pattern region and as well as to prevent the breakage of the alignment mark of the photosensitive substrate by exposure light while necessitating a relatively simple structure.

A second object is to provide a projection exposure apparatus in which an optical member for correcting the chromatic aberration and disposed in the projection optical system thereof is not irradiated with exposure light even if the variable light source method is applied to the irradiation optical system.

A third object is to provide a projection exposure apparatus capable of accurately aligning a mask and a photosensitive substrate even if the exposure process is being performed.

A projection exposure apparatus for achieving the first object comprises, as shown in FIGS. 1 and 2 for example, an exposure irradiation system for irradiating a mask; on which a predetermined pattern is formed, with first irradiation light for exposure, a projection optical system for imaging the image of a pattern region of the mask onto a photosensitive substrate under telecentric conditions, and alignment means for irradiating alignment mark formed on the photosensitive substrate with second irradiating light having a wavelength which is different from that of the first irradiation light by the projection optical system and detecting optical information generated from the mark by means of the projection optical system, the projection exposure apparatus, wherein an aperture plate is disposed on the pupil surface or adjacent to the same, the aperture plate having a shielding region which has functions of shielding a light beam, which is included by the first irradiation light generated from the mask and incident on the projection optical system, and which passes through a periphery of the pupil surface of the projection optical system and as well as passing the second irradiation light while deflecting them by predetermined quantities.

In the aforesaid apparatus, the alignment means comprises an alignment irradiation system for emitting the second irradiation light toward the shielding region of the aperture plate, and a mark detection system for photoelectrically converting, in the portion including the mask via the shielding region of the aperture plate, optical information generated from the mark when the alignment mark is irradiated with the second irradiation light deflected by the shielding region of the aperture plate and traveling toward the photosensitive substrate.

Furthermore, the shielding region of the aperture plate is, for example, so arranged that it deflects the incident second irradiation light by a predetermined quantity in substantially the radial direction with respect to the optical axis of the projection optical system as shown in FIG. 4.

Furthermore, the structure is, for example as shown in FIG. 1, so arranged that an alignment mark adjacent to the mask is formed in the vicinity of the pattern region of the mask, the second irradiation light is caused to pass through the mask side alignment mark, and also optical information generated from the mask side alignment mark due to the irradiation made with the second irradiation light is detected by the mark detection system.

Since the first invention is so arranged that the shielding region of the aperture plate is formed in the periphery of the pupil surface of the projection optical system, the second irradiation light is caused to travel toward the shielding region of the aperture plate by inclining the alignment irradiation system by a predetermined angle from the optical axis of the projection optical system so as to cause the second irradiation light to be incident on the projection optical system. In this case, since the shielding region has a function of deflecting the second irradiation light, the second irradiation light can be made to be assuredly incident on the alignment mark formed on the photosensitive substrate even if a horizontal or vertical chromatic aberration takes place in the projection optical system with respect to the second irradiation light due to the fact that the aperture plate is not provided. Since light reflected from the alignment mark reaches the mark detection system via the shielding region of the aperture plate, optical information from the alignment mark can be accurately detected.

Since the correction of the chromatic aberration is substantially performed by the deflection effect realized by the shielding region of the aperture plate in this case, a necessity of individually moving forwards/rearwards the optical system for correcting the chromatic aberration can be eliminated. Therefore, the alignment accuracy can be maintained satisfactorily and as well as the deterioration in the through-put can be prevented. Furthermore, since the first irradiation light for exposure is shielded in the shielding region of the aperture plate, the distortion of the exposed pattern due to the shielding region can be prevented.

A structure shown in FIG. 4 is so arranged that the shielding region of the aperture plate deflects the incidental second irradiation light in substantially the radial direction by a predetermined quantity with respect to the optical axis of the projection optical system. As can be seen from FIGS. 6 and 7 which are projection drawings FIG. 4 to the meridional surface and the sagital surface, it means a fact that the second irradiation light is deflected in the sagital direction and the meridional direction, causing the horizontal and vertical chromatic aberrations (the magnification chromatic aberration and the chromatic aberration on the axis) to be satisfactorily corrected.

In a case where the mask side alignment mark is formed in the vicinity of the pattern region of the mask, a TTR-type alignment mechanism can be formed. In this case, the first invention enables a necessity of positioning the mask side mark and the mark adjacent to the photosensitive substrate at the conjugate position with respect to the projection optical system under the first irradiation light for exposure to be enabled thanks to the deflection effect realized by the shielding region of the aperture plate. Hence, for example, the position of the mark adjacent to the mask can be set in a region (a region relatively away from the pattern region) through which the first irradiation light for exposure does not pass and as well as the position of the mark adjacent to the photosensitive substrate can be allowed to come closer to the pattern region. As a result of this, the breakage of the mark adjacent to the photosensitive substrate due to the first irradiation light for exposure can be prevented and as well as the intervals of the adjacent shot regions adjacent to the photosensitive substrate can be shortened. Therefore, the density of the transference and the exposure can be raised, that is, the number of the shot regions can be increased.

The structure according to the aforesaid first invention includes the aperture plate on which the shielding region having a function of deflecting the second irradiation light by a predetermined quantity and passing it is formed. Therefore, the alignment mark formed on the photosensitive substrate can be accurately irradiated with the alignment second irradiation light which has been incident on a portion outside the region through which the first irradiation light for exposure passes. Hence, the deterioration in the imaging performance in the exposure process can be prevented and as well as the alignment can be performed even if the exposure operation is being performed. As a result, an advantage can be realized in that the through put can be improved. Furthermore, the necessity of moving the alignment optical system can be eliminated, causing the alignment accuracy to be improved. In addition, the aperture plate disposed in the vicinity of the pupil surface of the projection optical system is effectively utilized, causing an effect to be obtained in that the structure of the overall optical system can be simplified.

Furthermore, since the position to be irradiated with the alignment second irradiation light can be freely controlled by the aperture plate, the alignment mark can be formed at, for example, a position adjacent to a region to which the pattern on the photosensitive substrate is transferred. Therefore, the interval between shot regions in a case where the transference and the exposure are repeated by the step-and-repeat method can be narrowed, causing an advantage to be obtained in that the shot configuration density can be raised. Furthermore, the region which is conjugate with respect to the alignment mark under the first irradiation light for exposure can be assuredly shielded. Therefore, the breakage of the alignment mark by the first irradiation light for exposure can easily be prevented.

In a case where the shielding region of the aperture plate is so arranged that it deflects the incident second irradition light in the radial direction by a predetermined quantity with respect to the optical axis of the projection optical system, an advantage can be obtained in that both of the horizontal and vertical chromatic aberrations with respect to the alignment light can be satisfactorily corrected.

If the mask side alignment mark is formed in the vicinity of the mask pattern region, it means a fact that the present invention is applied to the TTR system. Also in this case, the aforesaid advantages can be obtained.

A projection exposure apparatus capable of achieving the second object comprises, for example as shown in Figs. 13A and 13B, a first irradiation system for irradiating a mask pattern with exposure irradiation light supplied from a light source, a projection optical system for exposing the image of the mask pattern to a substrate under the first irradiation light, a second irradiation system for irradiating the mask pattern or the substrate with second irradiation light having a wavelength in a region which is different from that of the first irradiation light, one or a plurality of deflection members disposed in the projection optical system and making the surface on which the mask pattern is formed and the upper surface of the substrate to be conjugate to each other with respect to the projection optical system under the second irradiation light by deflecting the second irradiation light, and one or a plurality of shielding members disposed at a position which is conjugate with deflection members in the first irradiation optical system and shielding the first irradiation light.

In this case, a variable aperture diaphragm for varying the light quantity distribution of the first irradiation may be disposed on a surface corresponding to the optical Fourier transform with respect to the surface of the mask pattern in the first irradiation optical system.

Furthermore, laser beams may be employed as the first irradiation light for exposure.

According to the thus arranged second invention, an image (a dark image) of the shielding members in the first irradiation optical system due to the first irradiation light is formed on the deflection member in the projection optical system. As a result, the deflection member is not irradiated with the first irradiation light and therefore the problem of the breakage and the heat can be prevented.

In a case where the variable aperture diaphragm for varying the light quantity distribution of the first irradiation light is disposed on the surface corresponding to the optical Fourier transform with respect to the surface of the mask pattern in the first irradiation optical system, the state of the first irradiation light can be changed in accordance with the imaging characteristics of the mask pattern or the projection optical system by changing the shape of the position of the variable aperture diaphragm. If the position of the irradiation beam is the first irradiation optical system (the shape of the light source) is changed by using the variable aperture diaphragm, the conjugate relationship between the shielding member and the deflection member is not affected if the aforesaid change is performed in a portion more adjacent to the light source than the shielding member. Therefore, the present invention is able to cope with the deformation of the shape of the light source.

In a case where the laser beam is used as the first irradiation light for exposure, the possibility of the breakage of the deflection member is raised in particular. However, the deflection member is not irradiated with the laser beam according to the present invention. Therefore, the breakage of the deflection member can be prevented.

According to the second invention, the deflection member disposed in the projection optical system and arranged to correct the chromatic aberration of the second irradiation light can be protected from the undesirable irradiation with the first irradiation light for exposure. Therefore, the breakage of the deflection member due to the absorption of the first irradiation light can be prevented and heating, deformation and the change in the refraction factor of the other optical member due to heat of the deflection member can be prevented. Hence, the arrangement made in such a manner that the alignment mark is formed on the mask pattern surface and as well as the alignment mark is formed on the substrate will enable the positional relationship between the two marks to be directly and simultaneously measured. As a result, an advantage can be obtained in that accurate alignment can be realized.

Also in a case where a variable light source, which has been suggested recently, is used or an ordinary irradiation system and the variable light source are selectively used, the present invention enables the deflection member in the projection optical system, that is, the chromatic aberration correction member for the second irradiation light for alignment to be protected from the undesirable irradiation with exposure light.

In a case where the variable aperture diaphragm capable of varying the light quantity distribution of the first irradiation light is disposed on the surface corresponding to the Fourier transform with respect to the surface of the mask pattern in the first irradiation optical system, an advantage can be obtained in that the state of irradiation made with the first irradiation light can be brought to an optimal state in accordance with the mask pattern or the image forming characteristics of the projection optical system.

In a case where the laser beam is used as the first irradiation light for exposure, in particular in a case where the laser beam is the pulse laser such as eximar laser having high energy density per unit hour, the aforesaid deflection member or the like can be easily broken. Therefore, the present invention is particularly effective.

A projection exposure apparatus for achieving the third object has a projection optical system for imaging and projecting a pattern formed on a mask to the surface of a photosensitive substrate with irradiation light in a first wavelength region and exposes the pattern to light while superposing it on the shot region by means of the projection optical system after the position of the pattern and that of the shot region have been relatively aligned, the projection exposure apparatus comprising: first detection means for, by the projection optical system, irradiating a first mark formed adjacent to the pattern of the mask and a second mark formed adjacent to the shot region on the photosensitive substrate with irradiation light in substantially the same wavelength as that of the irradiation light in the first wavelength and as well as detecting light from each of the first mark and the second mark, second detection means for irradiating a third mark formed on the photosensitive substrate to have a predetermined positional relationship with the second mark with irradiation light having a second wavelength region which is different from the first wavelength region and as well as detecting light from the third mark, drive means for relatively moving the mask and the photosensitive substrate in a plane substantially perpendicular to the optical axis of the projection optical system, and control means for controlling the drive means in accordance with a detection signal supplied from the first detection means in such a manner that the quantity of the relative position deviation between the pattern of the mask and the shot region is made to be zero and as well as controlling the drive means in accordance with change in detection signals supplied from the second detection means in a period in which the pattern of the mask is exposed to the shot region.

The second detection means irradiates the third mark on the photosensitive substrate by the projection optical system with irradiation light in the second wavelength and as well as detects light from the third mark via the projection optical system. Furthermore, an optical device is disposed in the optical path for irradiation light in the second wavelength region, the optical device generating a magnification chromatic aberration in a direction opposing the direction of the magnification chromatic aberration of the projection optical system with respect to irradiation light in the second wavelength region.

Furthermore, the optical device is disposed on a plane of the projection optical system which becomes the Fourier transformed plane of the pattern of the mask or in a plane adjacent to the aforesaid plane.

In addition, the second mark on the photosensitive substrate and the third mark are the same.

According to the thus arranged third invention, the control means controls the drive means in accordance with a detection signal supplied when light is detected from each of the first mark and the second mark by the first detection mean so as to relatively move the mask and the photosensitive substrate in a plane which is substantially perpendicular to the optical axis of the projection optical system so that the quantity of the relative position deviation between the pattern of the mask and the shot region is made to be about zero. The drive means is controlled in accordance with the detection signal supplied when light from the third mark disposed to have a predetermined positional relationship with the second mark is detected by the second detection means in a period in which the pattern of the mask is exposed to the shot region so that the offset error which can be taken place at the time of the exposure can be reduced. Therefore, the pattern on the mask can be accurately transferred to the surface of the photosensitive substrate.

Other and further objects, features and advantages of the invention will be appear more fully from the following description.

BRIEF DESCRIPTION OF THE DRAWINGS

FIG. 2 is a plan view which illustrates an aperture plate according to the first embodiment shown in FIG. 1;

FIG. 6 is an X-directional projection drawing of FIG. 4;

FIG. 7 is a Y-directional projection drawing of FIG. 4;

FIG. 12 is a diagram which illustrates an essential portion of the optical system according to a third embodiment of the present invention;

DESCRIPTION OF THE PREFERRED EMBODIMENTS

Figure 1:
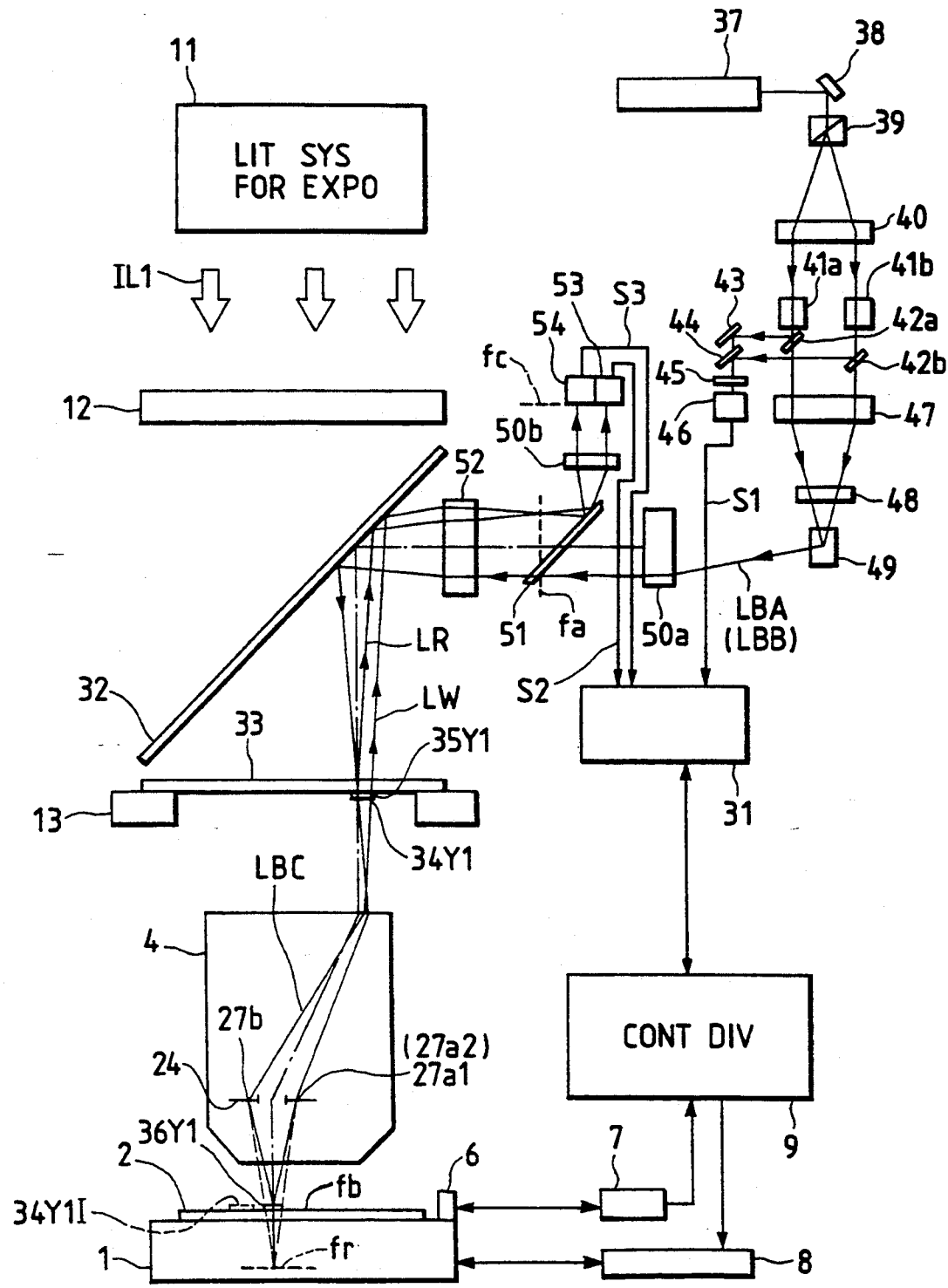
FIG. 1 illustrates the overall structure of a first embodiment of a projection exposure apparatus according to the present invention.
Figure 21:
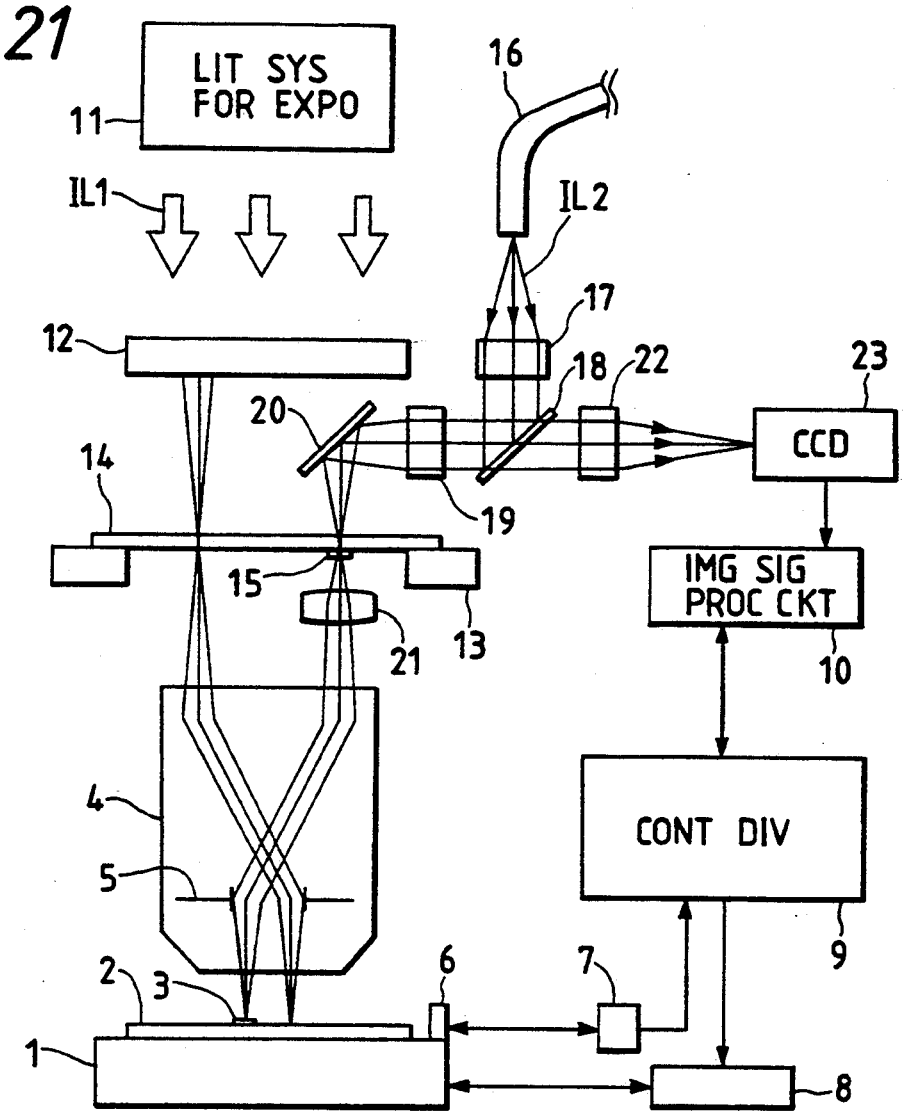
FIG. 21 is a structural view which illustrates a conventional projection exposure apparatus.
Figure 22:
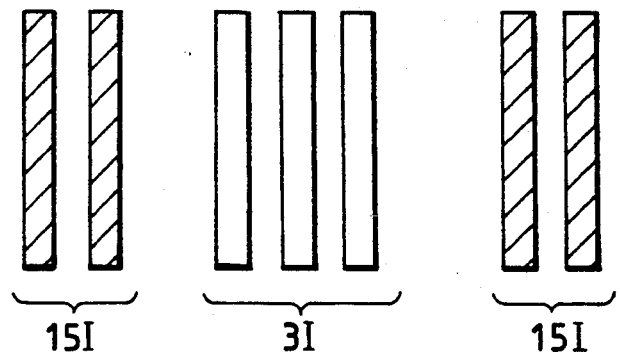
FIG. 22 is a diagram which illustrates a state where an image is formed on a surface on which the CCD shown in FIG. 21 receives light.
Figure 23:
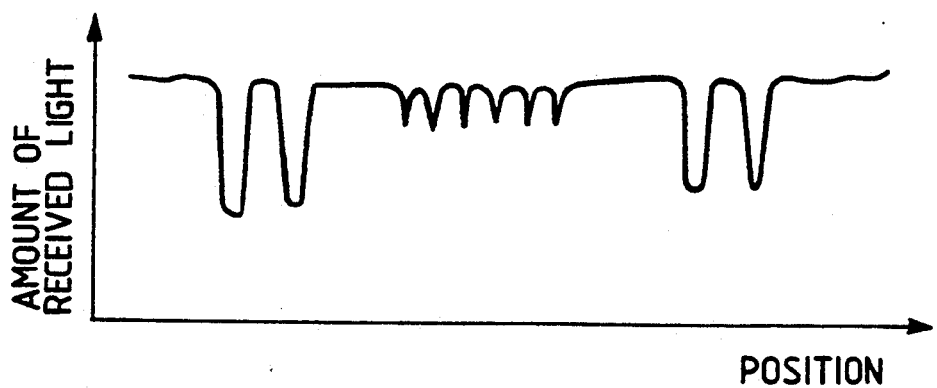
FIG. 23 is a diagram which illustrates an image pickup signal which corresponds to the state shown in FIG. 22 where an image is formed and which has been supplied from the CCD.
Figure 24:
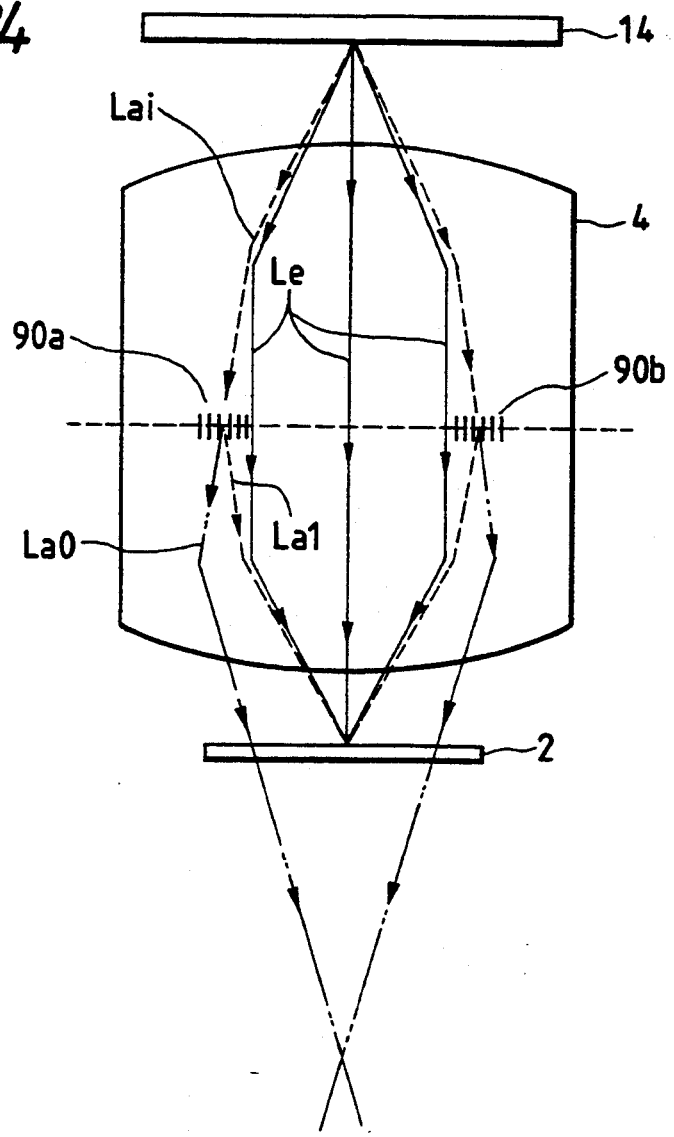
FIG. 24 is a diagram which illustrates the operation of the diffraction gratings disposed in the projection optical system.

A first embodiment of the present invention will now be described with reference to FIGS. 1 and 7. This embodiment is so arranged that the present invention is applied to a projection exposure apparatus for performing alignment by the TTR (Through-The-Reticle) method. Referring to FIG. 1, elements corresponding to those shown in FIG. 21 are given the same reference numerals and their descriptions are omitted here.

FIG. 1 illustrates the projection exposure apparatus according to the first embodiment. The description will be made hereinafter while making an assumption that an axis running parallel to the surface of the drawing sheet of FIG. 1 in a plane perpendicular to the optical axis of a double telecentric projection optical system 4 is y-axis and an axis perpendicular to the aforesaid surface of the drawing sheet is x axis. According to this embodiment, an aperture plate 24, which is different from that of the conventional example, is fastened to the pupil surface of the projection optical system 4. The aperture plate 24 is, as shown in FIG. 2, made of disc-like quartz and arranged in such a manner that a wavelength selective coating film (the dichroic film) for shielding exposure irradiation light but allowing alignment irradiation light to pass through is formed on the surface of an annular region 26 surrounding a central circular opening 25. Since the circular opening 25 is used to limit the number of apertures with respect to exposure irradiation light and exposure irradiation light is shielded by the annular region 26 surrounding the opening 26, the region 26 is called a "light shielding region" hereinafter.

Furthermore, 12 phase-type diffraction gratings are formed on the reverse side of the light shielding region 26. The 12 phase type diffraction gratings can be formed by etching the quartz in parallel at a predetermined pitch. However, diffraction gratings of an amplitude type formed by chrome evaporation or the like may be used in place of the phase-type diffraction gratings. In a case where the phase-type gratings are used, 0-order light can be limited. Therefore, the SN ratio of a signal for alignment can be improved as compared with case where the amplitude type gratings are used.

Referring to FIG. 2, the 12 diffraction gratings will now be described. First, two diffraction gratings 27a1 and 27a2 are symmetrically formed at the same pitch in a negative region of the y axis (a region in the lower portion with respect to the origin (the optical axis AX) of the coordinate when viewed in the drawing. Assuming that the center lines running parallel to the pitch direction of the two diffraction gratings 27a1 and 27a2 are L1 and L2 respectively, the center lines L1 and L2 intersect at point OP on the y-axis. Assuming that a straight line passing through the aforesaid point OP and running parallel to the optical axis AX is OP, the axis OP does not necessarily coincide with the optical axis AX of the projection optical axis 4. Then, a diffraction grating 27b is, in the direction of the y-axis, formed on the positive axis of the y-axis at a predetermined pitch. Similarly, diffraction gratings 28a1 and 28a2 are formed on both sides of the diffraction grating 27b. Furthermore, a diffraction grating 28b is formed on the y-axis at a position between the diffraction gratings 27a1 and 27a2. In addition, 6 diffraction gratings 29a1, 29a2, 29b, 30a1, 30a2 and 30b are formed along the x-axis at the positions obtained by rotating the 6 diffraction gratings disposed along the y-axis by an angular degree of 90°.

The y-axis directional mark of the wafer 2 shown in FIG. 1 is detected by using a set of diffraction gratings 27a1, 27a2 and 27b. Similarly, the y-axis directional mark of the wafer 2 is detected by using a set of diffraction gratings 28a1, 28a2 and 28b. The residual two sets of (6) diffraction gratings are used to detect the x-axis directional position of the wafer 2.

Referring back to FIG. 1, a signal processing circuit 31 generates a signal denoting the position deviation of the wafer 2 by the interference fringe alignment system by the heterodyne method so as to supply the thus-generated signal to a control device 9. a dichroic mirror 32 is disposed between a condenser lens 12 for condensing irradiation light IL1 emitted from an irradiation system 11 for exposure and a reticle 33 placed on a supporting member 13, the dichroic mirror 32 being disposed diagonally with respect to the optical axis of the projection optical system 4 by an angular degree of 45°. The dichroic mirror 32 has a transmission factor of 90% or more with respect to irradiation light IL1 for exposure and as well as it has a reflection factor of 50% or more with respect to irradiation light for alignment (the wavelength of which is longer than that of irradiation light for exposure). The pattern region of the reticle 33 is equally irradiated with irradiation light ILI which has passed through the dichroic mirror 32.

Figure 3A:
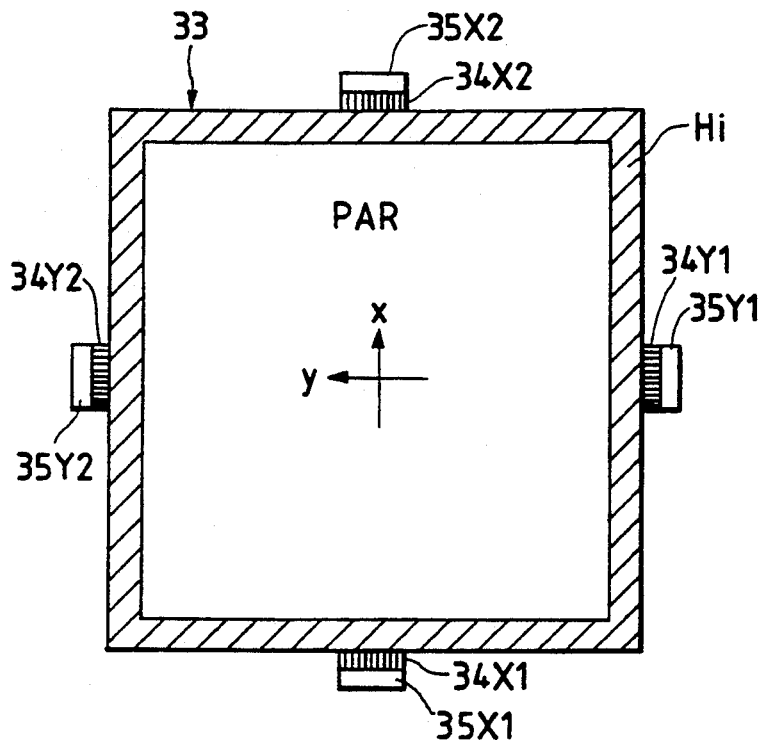
FIGS. 3A and 3B illustrate a pattern of a reticle and that of a wafer according to the first embodiment.

The reticle 33 according to this embodiment has, as shown in FIG. 3A, a light shielding zone Hi acting to shield both exposure light and alignment light and formed around a square pattern region PAR while having a predetermined width. Furthermore, diffraction gratings 34Y1 and 34Y2 serving as alignment marks are formed so as to be respectively positioned in contact with the light shielding zone Hi in the negative region and the positive region of the y-axis. Furthermore, window potions 35Y1 and 35Y2 through which alignment light passes are respectively formed outside the diffraction gratings 34Y1 and 34Y2. The diffraction gratings 34Y1 and 34Y2 respectively are reflection type diffraction gratings which are formed at a predetermined pitch in a direction x and through which about 50% of incident light passes as it is. Similarly, reflecting-type diffraction gratings 341 and 34X2 having a predetermined pitch in the direction y are so formed as to be positioned in contact with the light shield zone Hi in the negative region and the positive region of the x axis. Furthermore, window portions 35X1 and 35X2 are formed outside the aforesaid diffraction gratings.

The irradiation system 11 for exposure shown in FIG. 1 has a reticle blind for limiting the visible filed on the reticle 33 of irradiation light IL1 so that the outside of the light shielding zone H1 shown in FIG. 3A is not irradiated with irradiation light IL1. That is, the diffraction gratings 34Y1 to 34X2 positioned in contact with the light shielding zone Hi of the reticle 33 and the windows 35Y1 to 35X2 are not irradiated with irradiation light IL1 for exposure.

Figure 3B:
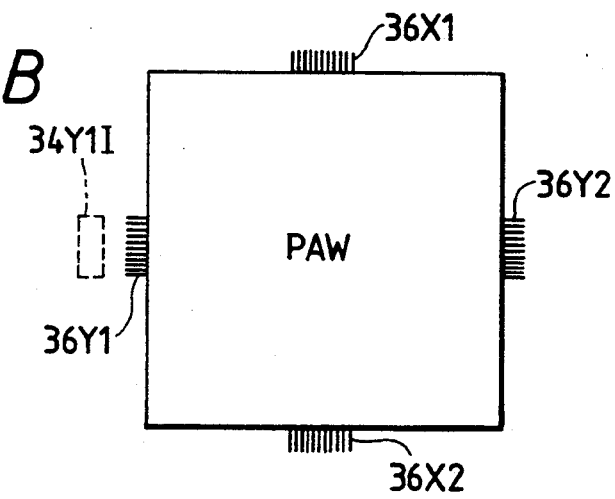

Then, reflecting type diffraction gratings 36Y1 to 36X2 are so formed in each shot region on the wafer 2 so as to correspond to the diffraction gratings 34Y1 to 34X2 formed on the reticle 33. FIG. 3B illustrates one shot region of a plurality of shot regions disposed to form a matrix configuration on the wafer 2. Referring to FIG. 3B, reflecting type diffraction gratings 36Y1 and 36Y2 having a predetermined pitch in the direction x are formed so as to be positioned in contact with a shot region PAW in a positive region and a negative region of the y-axis. Similarly, reflecting type diffraction gratings 36X1 and 36X2 having a predetermined pitch in the direction y are formed so as to be positioned in contact with the shot region PAW in a positive region and a negative region of the x-axis.

Assuming that the contraction ratio realized by the projection optical system is 1/N and the pitch of the diffraction grating 34Y1 and the like on the reticle 33 is P, the pitch of the diffraction grating 36Y1 and the like on the wafer 2 is set to 2P/N for example. Assuming that the contraction ratio realized by the projection optical system 4 is 1/5 and the pitch of the diffraction grating 34Y1 on the reticle 33 is 15 μm, the pitch of the diffraction grating 36Y1 on the wafer 2 is set to 6 μm.

In this case, the diffraction gratings 34Y1 and the like and the pattern region PAR are positioned in contact with each other on the reticle 33 while intervening the light shielding zone Hi. On the other hand, the diffraction gratings 36Y1 and the like are positioned in direct contact with the shot region PAW. This means a fact that the diffraction gratings 34Y1 and the like on the reticle 33 and the diffraction gratings 36Y1 and the like on the wafer 2 do not the conjugate relationship under irradiation light IL1 for exposure. Assuming that the position of a conjugate image of the diffraction grating 34Y1 on the reticle 33 to be formed on the wafer 2 under irradiation light IL1 is at position 34Y1I shown in FIGS. 1 and 3B, the aforesaid position 34Y1I is positioned considerably outside the diffraction grating 36Y1. Therefore, according to this embodiment, the width of a portion which is a boundary of the shot regions on the wafer 2 and in which the alignment mark is formed can be narrowed as compared with the conventional structure and as well as the breakage of the alignment mark (the diffraction grating 36Y1 and the like) on the wafer 2 due to irradiation light for exposure can be prevented. Incidentally, the diffraction gratings 34Y1 and the like and the window 35Y1 and the like are not irradiated with irradiation light IL1 due to the presence of the reticle blind. Therefore, the pickup images of them are not transferred onto the wafer 2.

According to this embodiment, the diffraction gratings 36Y1 to 36X2 on the wafer 2 are irradiated with alignment light which has passed through the diffraction gratings 34Y1 to 34X2 (exactly the window portions 35Y1 to 35X2) on the reticle 33. The reason for this lies in that alignment light is, as described later, warped due to the deflection action effected by the diffraction gratings formed in the light shielding zone 26 of the aperture plate 24. Furthermore, alignment light (1-order diffracted light) reflected from the diffraction gratings 36Y1 to 36X2 on the wafer 2 is caused to pass through the window portions 35Y1 to 35X2 on the reticle 33 and to be directed to the detection system due to the deflection action effected by the diffraction gratings formed in the light shielding zone 26 of the aperture plate 24.

Referring to FIG. 1, the TTR alignment optical system according to this embodiment will now be described in detail. As alignment light, light having a wavelength in a region in which decay can be restricted (weak photosensitivity) due to the resist on the wafer 2 is used, specifically, He Ne laser beam having a wavelength of 633 nm or the like is used. A laser beam source 37 generates laser beams of a linear polarization serving as alignment light, the laser beams being reflected by a mirror 38 for warping the optical path perpendicularly so as to be incident on a Wollaston prism 39 made of birefrigence crystal. The direction of the polarization of the laser beam is set to a direction which intersects the perpendicular crystal axis of the prism 39 at 45°. As a result, the prism 39 radially emits P-polarization laser beam and S-polarization layer beam the polarization directions of which intersect perpendicular.

A collimeter lens 40 has a front-focal plane at the position of the prism 39 so as to make the main beams of two laser beams to run parallel to each other. Either (P-polarization) of the parallel beams is incident on a first acoustic optical modulation device 41a, while the residual (S-polarization) laser beam is incident on a second acoustic optical modulation device 41b. The acoustic optical modulation devices 41a and 41b are able to deflect the frequency f of the laser beam, which passes through them, by f1 and f2 respectively. Therefore, the frequency of the P-polarization laser beam and that of the S-polarization laser beam are made to be different from each other by $\Delta f (=f1-f2)$. A portion of each P-polarization and that of the S-polarization laser beams emitted from the acoustic optical modulation devices 41a and 41b are picked up by corresponding beam splitters 42a and 42b. The picked up laser beams are synthesized by using the mirror 43 and the half mirror 44, the synthesized laser beams being then incident on a photoelectric conversion device 46 after it passes through a linear polarization plate 45.

A portion of the P-polarization laser beam and a portion of the S-polarization laser beam are formed into a circularly polarized light, and are made interfere with each other. As a result, a beat signal S1 having a frequency of $\Delta f$ is transmitted from the photoelectric converting device 46. The beat signal S1 is a standard signal for use at the time of performing the interference fringe alignment by the heterodyne method, the beat signal S1 being supplied to the signal processing circuit 31.

The laser beams, which have passed through the beam splitters 42a and 42b, are respectively converged onto a mirror 49 via a converging lens 47 and a $\frac{1}{4}$-wavelength plate 48. The P- and the S-polarization laser beams are, by the $\frac{1}{4}$-wavelength plate 48, converted into circularly polarized light the rotational directions of which are opposite to each other. Since circularly polarized light includes two-directional polarization factors which are perpendicular to each other, the two laser beams emitted from the $\frac{1}{4}$-wavelength plate 48 are coherent with each other. The aforesaid coherent laser beams are called laser beams LBA and LBB hereinafter.

The collimeter lens 50a has a front focal point at a point (the rear focal point of the lens 47) on the mirror 49 at which the two laser beams are converged. Therefore, by adjusting the angle of the mirror 49, the two laser beams LBA and LBB radially reflected from the mirror 49 are incident on the lower periphery of the lens 50a. Referring to FIG. 1, although the laser beams LBA and LBB are superposed but, in actual, the laser beam LBA passes inside and the laser beam LBB passes outside with respect to the surface of the drawing sheet. The two laser beams, the main beams of which have been made run parallel by the lens 50a, are incident on an objective lens 52 for alignment via a beam splitter (a half mirror) 51 diagonally disposed with respect to the optical axis of the lens 50a by an angle of 45°. Two laser beams (parallel beams) emitted from the objective lens 52 are downwards reflected by the dichroic mirror 32 and then they intersect on the diffraction grating 34Y1 (refer to FIG. 3A) formed on the reticle 33 and serving as the alignment mark.

Incidentally, in a portion between the lens 50a and the objective lens 52, the two main beams of the two laser beams LBA and LBB run parallel to the optical axis of the objective lens 52. Furthermore, this embodiment is arranged in such a manner that the two laser beams LBA and LBB are individually converged to form spots on the front foal plane fa of the objective lens 52 and as well as the rear focal plane of the objective lens 52 coincides with the surface of the reticle 33 on which the diffraction grating 34Y1 or the like is formed. As a result, the two laser beams LBA and LBB emitted from the objective lens 52 respectively are formed into parallel beams each having a predetermined diameter. The main beam of the laser beam LBA and that of the laser beam LBB intersect at a predetermined angle on the diffraction grating 34Y1 of the reticle 33. The angle of the intersection is so set that the pitch of the interference fringe generated on the diffraction grating 34Y1 due to the interference of the two laser beams is the half of the pitch of the diffraction grating 34Y1. As is known, the pitch of the interference fringe is set in accordance with the angle of the intersection of the two laser beams and the wavelength of the laser beam. The frequency of the laser beam LBA and that of the laser beam LBB is different from each other by $\Delta f$ which is the beat frequency. Assuming that the pitch of the interference fringe is Q, the phase of the interference fringe is therefore sequentially changed at a speed of $\Delta f \cdot Q$.

The diffraction grating 34Y1 according to this embodiment is formed at a predetermined pitch in a direction perpendicular to the surface of the drawing sheet on which FIG. 1 is drawn. Furthermore, the pitch of the interference fringe generated on the diffraction grating 34Y1 by the two laser beams is the half of the pitch of the diffraction grating 34Y1. Therefore, 1-order (hereinafter it is made to be +1-order) light of the incidental laser beam LBA diffracted by the reflecting type diffraction grating 34Y1 and passing toward outside with respect to the surface of the drawing sheet and 1-order (that is, −1-order) light of the residual laser beam LBB diffracted by the diffraction grating 34Y1 and passing toward inside with respect to the surface of the drawing sheet become coaxial and parallel receipt beams LR. Assuming that a plane including the optical axis of the projection optical system 4 and running parallel to the surface of the drawing sheet on which FIG. 1 is drawn is a meridional surface, the receipt beam LR becomes a laser beam which is returned toward the dichroic mirror 32 while being moved gradually away from the optical axis of the projection optical axis 4.

The receipt beam LR is reflected by the dichroic mirror 32, and then it is incident on a collimeter lens 50b via the objective lens 52 and the half mirror 51. An assumption is made here that the conjugate surface of the surface of the reticle 33 on which the diffraction grating 34Y1 is formed by means of the objective lens 52 and the lens 50b is fc. The light receipt surfaces of the photoelectric conversion devices 53 and 54 are disposed on the aforesaid conjugate surface fc and the receipt beam LR, which has been again converted into the parallel beam by the lens 50b, is incident on the photoelectric conversion device 53. The receipt beam LR is equivalent to a pattern formed by superposing the diffraction grating 34Y1 on the reticle 33 and the interference fringe formed on the diffraction grating 34Y1, and the phase of the aforesaid interference fringe is changed at the beat frequency. Therefore, a beat signal S2 having an amplitude which is changed in a sine wave shape at the beat frequency can be obtained from thee photoelectric conversion device 53, the beat signal S2 being supplied to the signal processing circuit 31. By subjecting the beat signal S2 on the reticle side and the standard beat signal S1 to a comparison, the deviation of diffraction grating 34Y1 on the reticle 33 from the standard position can be detected.

Then, the effect of the aperture plate 24 disposed in the projection optical system 4 according to this embodiment will now be described in detail. If the aperture plate 24 is not present, the surface of the reticle 33 on which the diffraction grating is formed and plane fb on the wafer 2 on which the diffraction grating is formed do not hold the conjugate relationship with respect to the projection optical system 4 under alignment light but the conjugation surface with respect to the surface of the reticle 33 on which the diffraction grating is formed becomes, for example, plane fr below the plane fb. The aforesaid chromatic aberration is removed by the aperture plate 24.

According to this embodiment, an adjustment has been made that the two laser beams LBA and LBB are incident on a lower periphery of the objective lens 52, that is, on a position deviated from the optical axis of the objective lens 52. Therefore, the two laser beams LBA and LBB emitted from the objective lens 52 and reflected from the dichroic mirror 32 are inclined in a direction in which they gradually move away from the optical axis AX of the projection optical system 4 in the radial direction (move radially) even if the optical axis of the objective lens 52 runs parallel to the optical axis AX of the projection optical system 4. The aforesaid degree of deviation between the optical axis AX of the projection optical system 4 and the incidental direction of the two laser beams LBA and LBB (the plane including each main beam) with respect to the projection optical system 4 is called a "telecentric degree" and the sign of the telecentric degree in a state shown in FIG. 1 is made to be positive. The degree and the sign of the telecentric degree can be arbitrarily set by adjusting the angle of inclination of the mirror 49 in front of the lens 50a. According to this embodiment, the telecentric degree, in particular, that in the meridional direction is adjusted so as to cause the two laser beams LBA and LBB, which have passed through the diffraction grating 34Y1 of the reticle, to be incident on the diffraction gratings 27a2 and 27a1 (see FIG. 2) formed in the light shielding zone 26 of the aperture plate 24 in the projection optical system 4.

Figure 4:
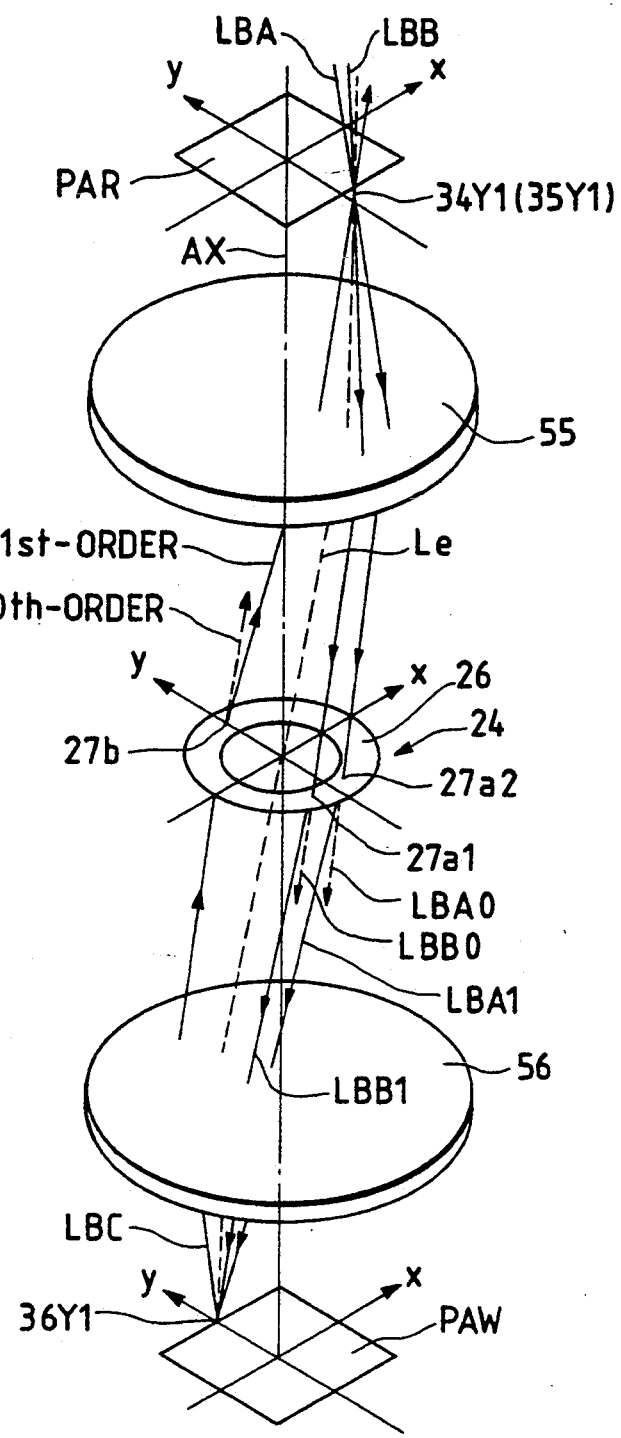
FIG. 4 is a perspective view which illustrates the operation of the aperture plate shown in FIG. 1.

Assuming that a lens system in front of the aperture plate 24 of the projection optical system 4 is given reference numerical 55 and a lens system in the rear of the same is given reference numerical 56 as shown in FIG. 4, laser beams LBA and LBB respectively are warped by the lens system 55 so as to be incident on the diffraction gratings 27a2 and 27a1. The aforesaid diffraction gratings 27a1 and 27a2 are, as shown in FIG. 2, formed at a predetermined pitch in a direction of axis OP adjacent to the optical axis AX of the projection optical system 4. As shown in FIG. 4, 1-order light LBB1 deflected toward the optical axis AX with respect to 0-order light LBB0 of the laser beam LBB is emitted from the diffraction grating 27a1, while 1-order light LBA$_1$ deflected toward the optical axis AX with respect to 0-order light LBA$_0$ of the laser beam LBA is emitted from the diffraction grating 27a2.

Figure 5:
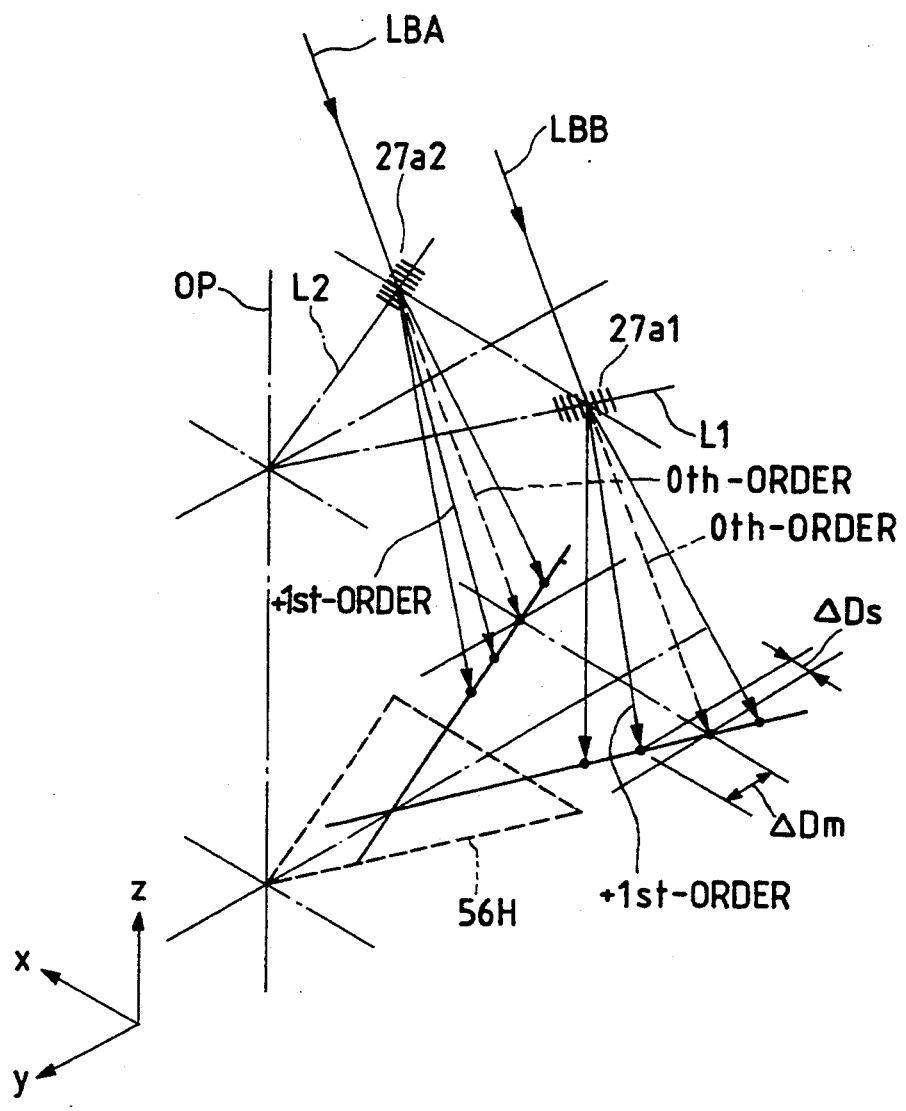
FIG. 5 is an enlarged perspective view which illustrates an essential portion of FIG. 4.

Referring to FIG. 5 for further details, beams of diffracted light, i.e., 0-order light, +1-order light, +2- order light, . . . , and −1 order light, −2-order light, . . . , are emergent from the diffraction grating 27a1 so as to diverge two-dimensionally with the beam of 0-order light extending at the center. The points of intersection of these diffracted light beams and a plane 56H parallel to the major plane of the lens system 56 are located on a straight line intersecting with the y-axis at a predetermined angle. Similarly, beams of diffracted light, i.e., 0-order light, +1-order light, +2-order light, . . . , and −1 order light, −2-order light, . . . , are also emergent from the diffraction grating 27a2 so as to diverge two-dimensionally with the beam of 0-order light extending at the center. The points of intersection of these diffracted light beams and the plane 56H are located on another straight line intersecting with the y-axis at a predetermined angle. Accordingly, the +1-order diffracted light beam emergent from the diffraction grating 27a1, for example, is shifted from the +1-order light beam in the directions along the x- and y-axes toward the axis OP by ΔDs and ΔDm, respectively, on the plane 56H. Lateral and longitudinal chromatic aberrations are thereby substantially corrected. However, since the diffraction gratings 27a1 and 27a2 and so on in accordance with the present invention are phase type diffracrtion gratings, it is possible to reduce the intensity of 0-order light to substantially naught while increasing the intensity of +1-order diffracted light alone. Laser beams other than the +1-order light can therefore be ignored.

Referring back to FIG. 4, the 1st-order diffracted light beams LBB$_1$ and LBA$_1$ emergent from the diffraction gratings 27a1 and 27a2 are respectively deflected by the lens system 56 to be converged as an alignment mark at the reflection type diffraction grating 36Y1. These diffracted light beams on the wafer 2 are parallel bundles of rays each having a predetermined diameter. FIG. 6 and 7 are diagrams formed by projection of FIG. 4 in the directions x and y, respectively. As can be understood from FIG. 6, the influence of a lateral chromatic aberration on the alignment light is removed substantially completely.

Referring to FIG. 4, interference fringes having a predetermined pitch in the direction x are also formed on the diffraction grating 36Y1 on the wafer 2 by the diffracted light beams LBB$_1$ and LBA$_1$. The pitch of these interference fringes is ½ of the pitch of the diffraction grating 36Y1 in the direction x. Accordingly, the 1st-order (referred to as "+1-order) diffracted light beam in the positive direction of the x-axis caused by the diffraction grating 36Y1 from the diffracted light beams LBB$_1$ and the −1-order diffracted light beam caused by the diffraction grating 36Y1 from the diffracted light beams LBA$_1$ form a coaxial and parallel laser beams LBC which also exists in the meridional plane and which travels in the direction toward the lens system 56.

The laser beam LBC is bent by the lens system 56 to irradiate the diffraction grating 27b in the shielding zone 26 of the aperture plate 24. Since the diffraction grating 27b is formed at a predetermined pitch in the direction along the y-axis as shown in FIG. 2, 1st-order diffracted light therefrom is deflected toward the optical axis AX while 0-order light passes straight therethrough. The diffraction grating 27b also is of the phase type, and the intensity of light of orders other than the 1st-order in the diffracted light from this diffraction grating is therefore negligibly small in comparison with the 1st-order diffracted light. The 1st-order diffracted light beam from the diffraction grating 27b is bent by the lens system 55 to be incident upon the window 35Y1 (see FIG. 3A) formed adjacent to the diffraction grating 34Y1 on the reticle 33. A laser beam upwardly passing the window 35Y1 corresponds to the received light beam LW shown in FIG. 1.

Referring again to FIG. 1, the received light beam LW is reflected by the dichroic mirror 32 in parallel with the received light beam LR to be incident upon the objective lens 52. The received light beam LW from the objective lens 52 travels to the photoelectric conversion element 54 via the half mirror 51 and the lens 50b. The intensity of the received light beam LW is obtained by superposing the diffraction grating 36Y1 on the wafer 2 and the interference fringes formed on this diffraction grating, and the phase of interference fringes of the received light beam LW is also changed at a beat frequency Δf. Therefore, a signal obtained from the photoelectric conversion element 54 is obtained as a beat signal S3 having the frequency Δf. This beat signal S3 is supplied to the signal processing circuit 31. The signal processing circuit 31 compares the phases of the beat signal S3 on the wafer side 2 and the reference beat signal S1 to detect the shift of the diffraction grating 36Y1 on the wafer 2 from the reference position. Consequently, the shifts of the positions of the diffraction grating 34Y1 on the reticle 33 and the diffraction grating 36Y1 on the wafer 2 can be detected with an accuracy of a several percent of the pitch of the diffracting gratings.

The projection exposure apparatus shown in FIG. 1 is also provided with three sets of alignment optical systems in correspondence with the other three groups of diffraction gratings on the reticle 33, although they are not illustrated. It is thereby possible to perform alignment of the diffraction gratings 36Y2, 36X1 and 36X2 (see FIG. 3B) on the wafer 2 and, hence, accurate alignment with respect to parallel movement and rotation of the reticle 33 and the wafer 2.

In this embodiment, as described above, the diffraction grating 27a1 and so on are provided as members for deflecting alignment light beams in the shielding zone 26 of the aperture plate 24 in the projection optical system 4 to make the alignment light incident upon the projection optical system 4 with a predetermined telecentricity to irradiate the diffraction gratings thereof. It is therefore possible to irradiate the diffraction grating 36Y1 and so on on the wafer 2 with the alignment light while removing chromatic aberrations in the projection optical system 4 with respect to the alignment light substantially completely. In this case, no two-focal-point optical system such as that used in the conventional interference fringe alignment method is used. This is advantageous in that the construction of the optical system can be simplified and the length of the optical system for alignment in the direction along the optical axis can be reduced.

In this embodiment, the diffraction grating 34Y1 on the reticle and the diffraction grating 36Y1 on the wafer are substantially conjugate and corresponding to each other in a lateral direction with respect to the alignment light. However, they are not always conjugate and corresponding to each other in a lateral direction with respect to the exposure light. That is, in this embodiment, the alignment light can be led to a point on the wafer 2 arbitrary to some extent by the deflecting effect of the diffraction grating 27a1 and so on provided on the periphery of the aperture plate 24. It is thereby possible to freely select, for example, an arrangement in which the diffraction grating 36Y1 on the reticle is distanced from the pattern region while placing the diffraction grating 36Y1 on the wafer adjacent to the shot region. This is advantageous in that the diffraction grating as an alignment mark on the wafer 2 can be secured against damage from the exposure light with certain reliability and the street line regions between the shot regions to increase the shot arrangement density.

The above-described embodiment can be modified as described below.

First, the diffraction grating 27a1 and so on, which are formed as members for deflecting the alignment light in the shielding zone 26 of the aperture plate 24, can be replaced with other kinds of members so long as the replacing members are capable of deflecting the alignment light in both the meridional and sagittal directions. For example, prisms, phase plates, hologram plates or the like can be used in place of the diffraction gratings.

The photoelectric conversion elements 53 and 54 are provided on the plane fc conjugate with the reticle (at the imaging position of interference fringes or the like) in the arrangement of shown in FIG. 1, because it is thereby possible to separate the interference fringes on the reticle 33 side and the interference fringes on the wafer 2 side comparatively easily. To improve the SN ratio by removing o-order reflected diffracted light and high-order reflected diffracted light other than 1st-order reflected diffracted light, however, it is desirable to separate the two interference fringes at the conjugate plane fc by the aperture, change each of them by Fourier transformation with relay lenses, and thereafter receive them separately by photoelectric conversion elements at the pupil position.

The second embodiment of the present invention will be described below with reference to FIGS. 8 to 11. In this embodiment as well, the present invention is applied to an apparatus using a TTR system for alignment. In this embodiment, however, an alignment mark on the reticle and an alignment mark of the wafer are not conjugate with respect to the alignment light. Components of this embodiment corresponding to those of the first embodiment are indicated by the same reference characters, and the description for details of them will not be repeated.

Figure 8:
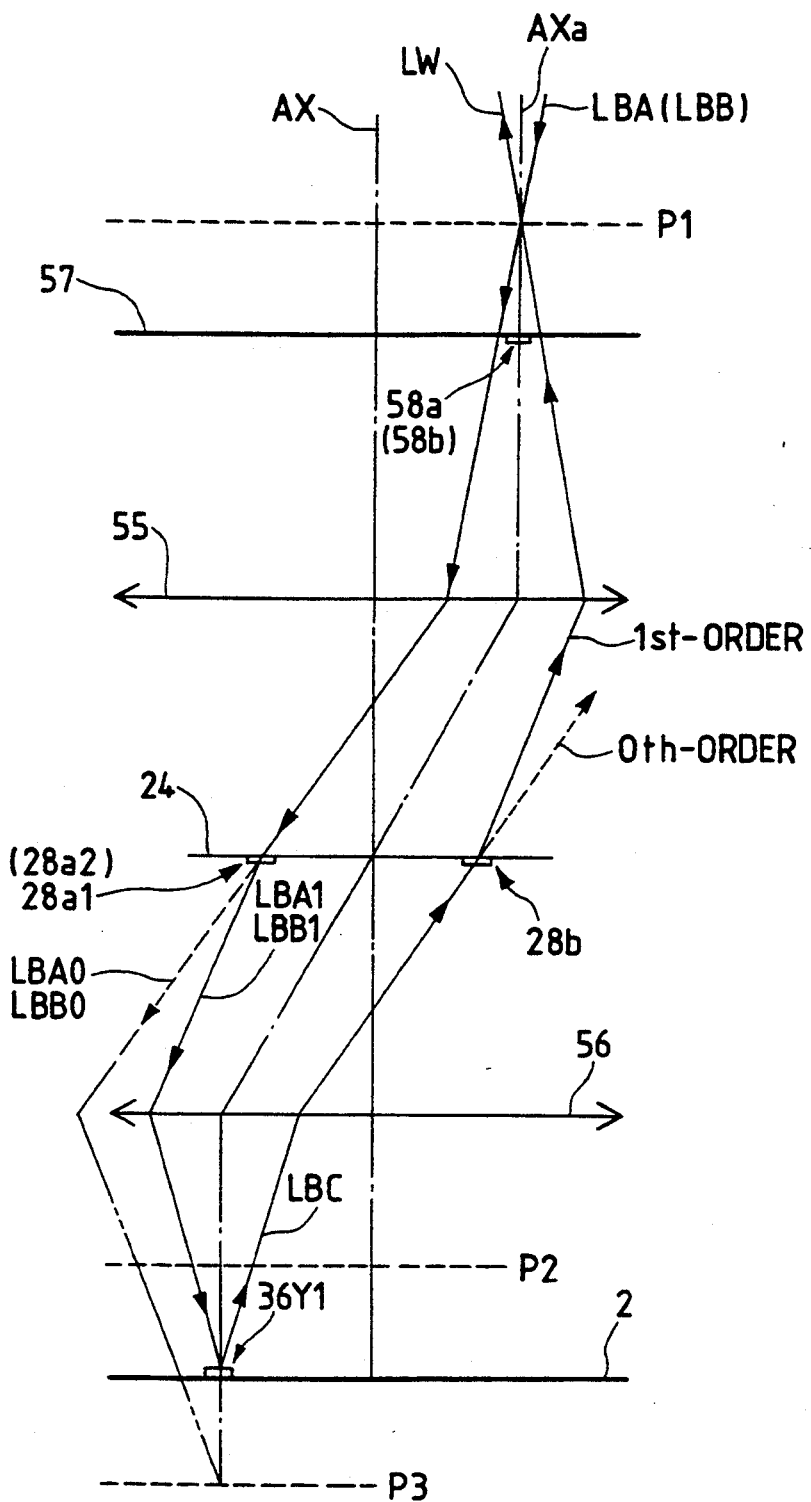
FIG. 8 is a diagram which illustrates an essential portion of the optical system according to a second embodiment of the present invention when viewed from a sagital direction.

FIG. 8 shows the construction of an essential portion of the optical system of this embodiment viewed in the sagittal direction. A front lens 55 and a rear lens 56 constitute the same projection optical system as that shown in FIG. 1, and an aperture plate 24 having the same construction as that shown in FIG. 2 is mounted between the lens system 55 and the lens system 56 (at the pupil plane). A diffraction grating is also formed as an alignment mark in the vicinity of the pattern region of a reticle 57 used in this embodiment. In this embodiment, however, a pair of diffraction gratings 58a and 58b are formed in a region in the positive direction of the y-axis. The diffraction gratings 58a and 58b are arranged in the direction perpendicular to the paper of FIG. 8, the diffraction grating 58a being formed on the foreground side as viewed in FIG. 8, and the diffraction grating 58b being formed on the background side. Similarly, other three pairs of diffraction gratings are formed on the reticle 57, although they are not illustrated.

Figure 11:
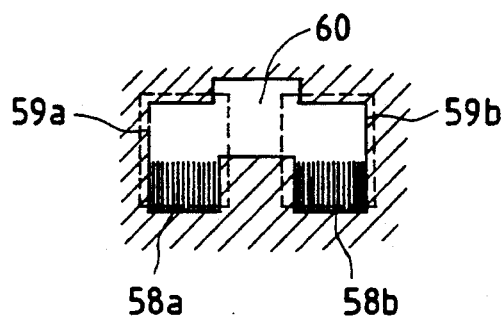
FIG. 11 is a bottom view which illustrates the structure of an essential portion of the reticle shown in FIG. 8.

The shape and other properties of the diffraction gratings on the reticle 57 will be described below in detail with reference to FIG. 11. As shown in FIG. 11, one pair of diffraction gratings 58a and 58b are formed in opposite end portions of a generally U-shaped opening. Rectangular regions 59a and 59b including the diffraction gratings 58a and 58b are irradiated with laser beams LAB and LBB provided as alignment light, and a received light beam from the wafer 2 passes through a central reticle window 60, as described later.

Figure 9:
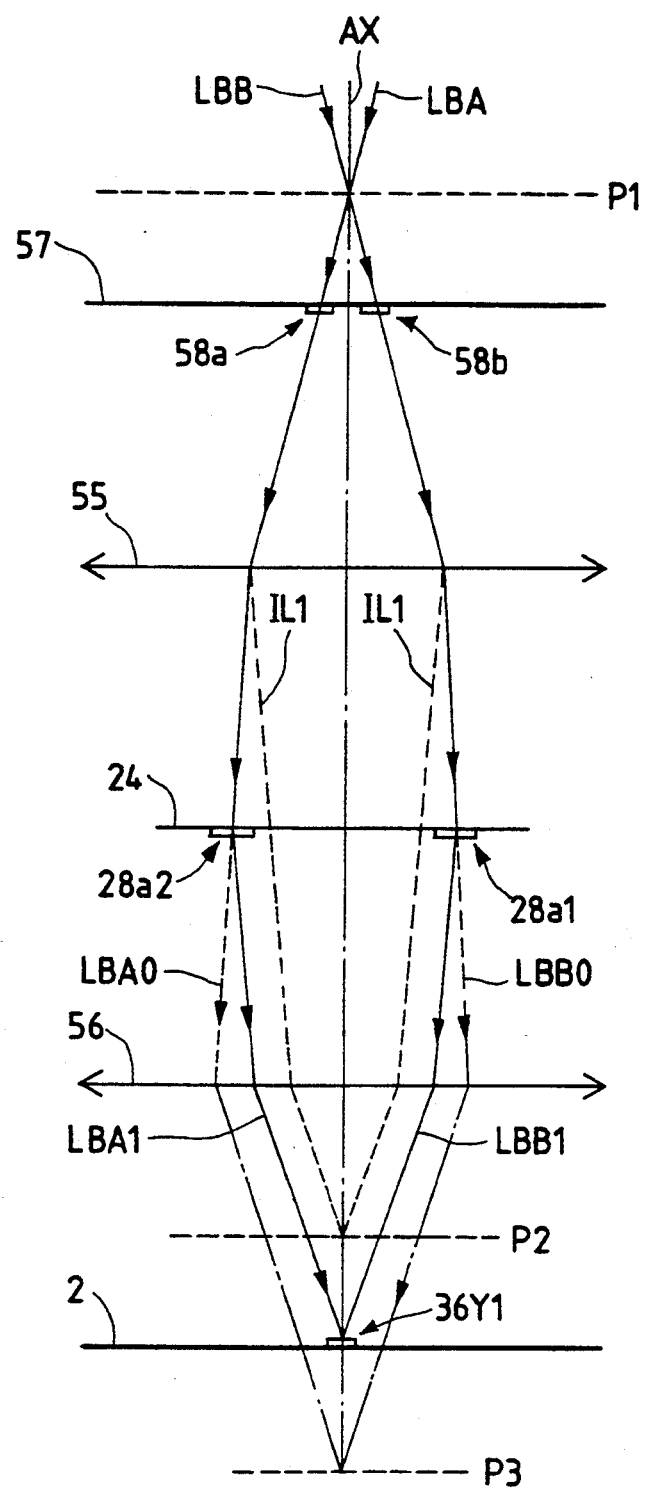
FIG. 9 is a diagram which illustrates an essential portion of the optical system according to the second embodiment when viewed from a meridional direction.

FIG. 9 shows a state of the optical system of FIG. 8 viewed in the meridional direction. In this embodiment, as shown in FIG. 9, two laser beams LBA and LBB provided as alignment light intersect at a plane P1 at a distance from the reticle 57 on the exposure illumination system side. After intersecting at the plane P1, the two laser beams LBA and LBB travel while expanding radially to be incident upon the diffraction gratings 58a and 58b on the reticle 57. (strictly speaking, they are incident upon the regions 59a and 59b shown in FIG. 11). The laser beams passing through the diffraction gratings 58b and 58a are bent by the lens system 55 to irradiate diffraction gratings 28a1 and 28a2 formed in the shielding zone of the aperture plate 24. At this time, in this embodiment, the two laser beams LBA and LBB are led to the reticle 57 so as to become closer to the optical axis AX, i.e., at a negative telecentricity, as shown in FIG. 8. To make the laser beams LBA and LBB at the plane P1, the optical system may be arranged so that the rear focal plane of the objective lens 52 shown in FIG. 1 coincides with the plane P1.

Referring to FIG. 9, from the diffraction grating 28a1 on the aperture 24, a 1st-order diffracted light beam $LBB_1$ is emergent in a direction deflected toward the optical axis AX relative to a 0-order diffracted light beam $LBB_0$, and, from the other diffraction grating 28a2, a 1st-order diffracted light beam $LBA_1$ is emergent in a direction deflected toward the optical axis AX relative to a 0-order diffracted light beam LBAO. These 1st-order diffracted light beams $LBB_1$ and $LBA_1$ are further deflected by the lens system 56 to be converged at a diffraction grating 36Y1 provided as an alignment mark on the wafer 2.

That is, in this embodiment, the plane substantially conjugate with the diffraction grating formation plane on the wafer 2 with respect to the alignment light through the projection optical system 4 corresponds to the plane P1 above the reticle 57. In this case, the plane conjugate with the plane P1 with respect to exposure illumination light IL1 is a plane P2 closer to the lens system 56 than the wafer 2. (Needless to say, the reticle 57 and the wafer 2 are conjugate with respect to illumination light IL1). If the diffraction gratings 28a1 and 28a2 of the aperture plate 24 do not exist, the 0-order light beams $LBA_0$ and $LBB_O$ are converged at a plane P3 below the wafer 2 with respect to the alignment light. Accordingly, it may be considered that a longitudinal chromatic aberration of the alignment light is substantially corrected by the deflecting effect of the diffraction gratings of the aperture plate 24. Also, referring to FIG. 8, if the diffraction gratings 28a1 and 28a2 of the aperture plate 24 do not exist, the 0-order light beams $LBA_0$ and $LBB_0$ are incident at a position on the wafer 2 at a distance from the diffraction grating 36Y1 in the direction y. This signifies that a lateral chromatic aberration of the alignment light is substantially corrected by the deflecting effect of the diffraction gratings of the aperture plate 24.

1st-order diffracted light on the background side of FIG. 8 (referred to as +1-order diffracted light) caused by the diffraction grating 36Y1 on the wafer 2 from the diffracted light beam LBA1 and −1-order diffracted light caused by the diffraction grating 36Y1 from the diffracted light beam LBB1 form a coaxial and parallel laser beam LBC. This laser beam LBC exists in the meridional plane and travels toward the lens system 56.

The laser beam LBC is bent by the lens system 56 to irradiate the diffraction grating 28b in the shielding zone 26 of the aperture plate 24. Since this diffraction grating 28b is formed at a predetermined pitch in the direction along the y-axis as shown in FIG. 2, 1st-order diffracted light therefrom is deflected toward the optical axis AX while 0-order light passes straight therethrough. The diffraction grating 28b also is of the phase type, and the intensity of light of orders other than the 1st-order in the diffracted light from this diffraction grating is therefore negligibly small in comparison with the 1st-order diffracted light. The 1st-order diffracted light beam from the diffraction grating 28b is bent by the lens system 55 to be incident upon the reticle window 60 (see FIG. 11) formed between the diffraction gratings 58a and 58b on the reticle 57. A received light beam LW upwardly passing the reticle window 60 intersects the introduced laser beams LBA and LBB in a reverse direction at the plane P1. This received light beam LW is also led to a photoelectric conversion element, as in the case of the arrangement shown in FIG. 1.

Figure 10:
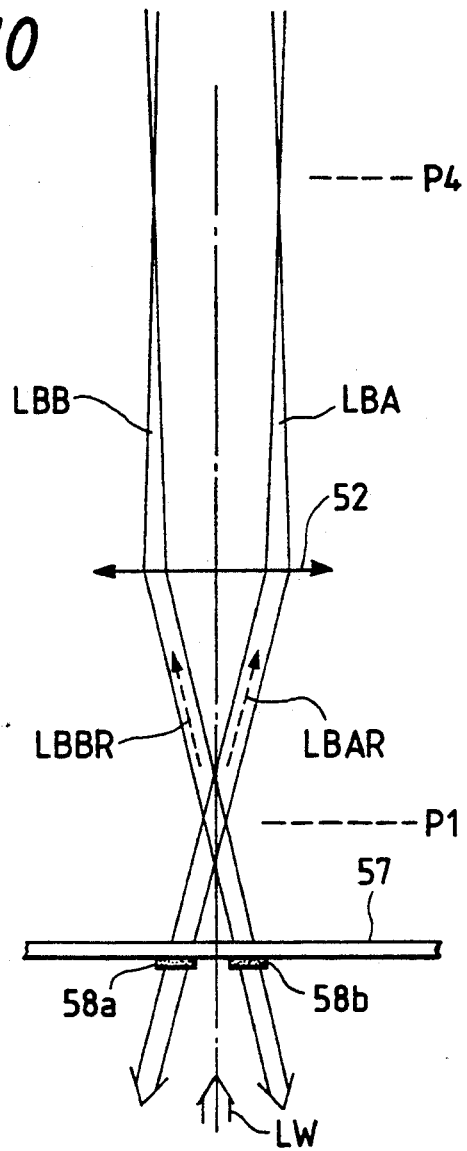
FIG. 10 is a diagram which illustrates an optical system for alignment according to the second embodiment.

Referring to FIG. 10, the method of detecting interference fringes from the reticle 57 in accordance with this embodiment will be described below with reference to FIG. 10. In FIG. 10, the reticle 57 is viewed in the meridional direction. As shown in FIG. 10, the laser beams LBA and LBB emergent from the objective lens 52 for alignment intersect each other at the plane P1 and thereafter travel respectively to the diffraction gratings 58a and 58b on the reticle 57. In this embodiment, the pitch of the diffraction gratings 58a and 58b is selected so that the 1st-order reflected diffracted light beams LBAR and LBBR are returned parallel to the direction of incidence of the laser beams LBA and LBB. The reflected diffracted light beams LBAR and LBBR intersect at the plane P1 and are thereafter pass the objective lens 52, so that their principal rays become parallel. The diffracted light beams LBR and LBB are independently converged at a plane P4 above the objective lens 52, while the laser beams passing through the reticle 57 are independently converged at the pupil plane of the projection optical system 4. Therefore, the plane P4 is a plane conjugate with the pupil surface of the projection optical system 4.

In this embodiment, the plane conjugate with the plane P1 at which the reflected diffracted light beams LBAR and LBBR is set as the plane fc corresponding to the light receiving surface of the photoelectric conversion elements 53 and 54 in the arrangement shown in FIG. 1. Interference fringes of the reflected diffracted light beams LBAR and LBBR are thereby formed on the plane fc. These interference fringes are substantially equal to a pattern obtained by superposing the diffraction grating 58a (or 58b) and the interference fringes formed by the laser beams LBA and LBB. A phase-modulated beat signal can therefore be obtained by photoelectrically converting this pattern. Similarly, since the plane P1 is conjugate with the diffraction grating formation surface on the wafer with respect to the alignment light, a beat signal indicating the position of the wafer 2 can be obtained by photoelectrically converting the laser beam LW, i.e., the reflected diffracted light (interference light) from the wafer 2 at the light receiving surface conjugate with the plane P1.

In this embodiment, as described above, while the diffraction gratings on the reticle 57 and the diffraction gratings on the wafer 2 are not conjugate with respect to the alignment light, the positions at which interference fringes of the respective reflected diffracted beams are formed are set to the same plane P1. It is thereby possible to obtain two types of phase-modulated beat signals with reliability and stability. In this case, the plane P1 can easily be moved along the optical axis AX, thereby facilitating the adjustment of the optical system. This embodiment is advantageous in this respect. The basic construction of this embodiment is described in the specification of Ser. No. 687,944 (Apr. 19, 1991).

The third embodiment of the present invention will be described below with reference to FIG. 12. In this embodiment, the present invention is applied to a projection exposure apparatus using a TTR (through the lens) system for alignment. Components in FIG. 12 corresponding to those shown in FIG. 1 are indicated by the same reference characters, and the description for details of them will not be repeated.

FIG. 12 shows the construction of an essential portion of this embodiment including a projection optical system 4. As shown in FIG. 12, only a pattern region PAR is defined on the reticle 61 and no alignment marks are formed. An illumination region 62 including the pattern region PAR is uniformly irradiated with exposure illumination light IL1 led from above and having a wavelength range in which the photosensitivity of the resist is high (i rays having a wavelength of 36 nm, g rays having a wavelength of 436 nm, excimer laser light having a wavelength of 248 nm or the like). As alignment light, He-Ne laser light having a wavelength of 633 nm, for example, is used. Diffraction gratings are formed as alignment marks in street line regions 63a, 63b, ... at the boundaries between shot regions PAW1, PAW2, PAW3, ... on the wafer 2 corresponding to the pattern region PAR of the reticle 61.

An aperture plate 24 is also fixed at a pupil section of the projection optical system 4 of this embodiment, and a thin film (dichroic coating film) 64 having a wavelength selecting property such as to cut the exposure illumination light IL1 while passing the alignment light is formed on a peripheral portion of the aperture plate 24 at a distance from the optical axis AX. Diffraction gratings 28a1, 28a2 and 28b are formed on a surface below the thin film 64, as in the case of the arrangement shown in FIG. 2. Correspondingly, other three groups of diffraction gratings are also formed. In this embodiment, an alignment objective lens 65 is fixed at a side surface portion of the projection optical system 4, and a fixed mirror 66 for changing the direction of an optical path along the optical path AXa of the objective length 65 by 90° to the projection optical system 4 is disposed on the optical axis AXa. Further, a fixed mirror 67 is disposed on the optical axis changed by the fixed mirror 66 by being inclined approximately at 45°. The position of the fixed mirror 67 is set outside the exposure illumination region 62. In other respects, the construction of this embodiment is generally the same as that shown in FIG. 1. In this embodiment, however, only one a photoelectric conversion element for outputting a phase-modulated beat signal for detecting only an alignment mark on the wafer is used with respect to one set of alignment optical system.

The alignment operation of this embodiment will be described below. Two laser beams LBA and LBB having principal rays parallel to each other are led to the objective lens 65 from below The laser beam LBA passes through the lens 65 on the foreground side as viewed in FIG. 12, while the laser beam LBB passes on the background side. The laser beams LBA and LBB emergent from the objective lens 65 travel via the fixed mirrors 66 and 67 to be incident upon the projection optical system 4 obliquely relative to the optical axis AX thereof with a negative telecentricity. The two laser beams LBA and LBB intersect each other, for example, at a plane P6 between the fixed mirrors 66 and 67. However, in this embodiment as well, each of the laser beams LBA and LBB emergent from the objective lens 65 is a bundle of parallel rays having a predetermined diameter.

The laser beams LBA and LBB incident upon the projection optical system 4 are respectively led to the diffraction gratings 28a1 and 28a2 on a peripheral portion of the aperture plate 24. 1st-order diffracted light beams are respectively emergent from the diffraction gratings 28a1 and 28a2 in a direction deflected toward the optical axis AX relative to 0-order light beams. These two 1st-order diffracted light beams intersect at the diffraction grating formed on the street line region 63b of the wafer 2. Accordingly, the diffraction grating formation surface of the wafer 2 is conjugate with the plane P6 with respect to the alignment light through the projection optical system 4. If the fixed mirror 67 does not exist, a plane P5 above the reticle 61 is conjugate with the the diffraction grating formation surface of the wafer 2 due to an axial chromatic aberration. Since each of the laser beams LBA and LBB is a bundle of parallel rays at the plane P6, the two diffracted light beams are also bundles of parallel rays having a predetermined diameter on the wafer 2.

Beams of +1-order and −1-order reflected diffracted light from the street line region 63b interfere with each other by forming a coaxial and parallel laser beam in the meridional plane. This laser beams is incident upon the diffraction grating 28b of the aperture plate 2. A 1st-order diffracted light beam is emergent from the diffraction grating 28b in a direction deflected toward the optical axis AX relative to the 0-order light. This 1st-order diffracted light beam travels via the fixed mirrors 67 and 66 to return to the objective lens 65. The laser beam returned to the objective lens 65 is led as a received light beam LW to a photoelectric conversion element through an unillustrated lens. The received light beam LW is obtained as interference light of diffracted light which, when interference fringes formed on the diffraction grating on the wafer 2 (flowing one-dimensionally) and the diffraction grating are superposed, is generated in the same direction. Consequently, a beat signal phase-displaced with respect to a reference signal can be obtained in correspondence with the diffraction grating position on the wafer 2 by photoelectrically converting the received light beam LW.

In accordance with this embodiment, as described above, the alignment light is deflected by the diffraction grating formed as a deflecting member on a peripheral portion of the aperture plate 24. Therefore, the alignment light, which is led from the fixed mirror 67 provided outside the illumination region 62 (i.e., the pattern region PAR), and which is incident upon the projection optical system 4 with a predetermined telecentricity, can be accurately incident upon the diffraction grating formed as an alignment mark close to the shot region PAW2 on the wafer 2. In this case, because the diffraction grating is not illuminated with exposure light, it can be prevented from being damaged by exposure. Also, the distance between adjacent shot regions can be reduced to increase the shot array density.

In the above-described embodiment, an aperture plate on which deflecting members are formed is used to effect alignment. However, such an aperture plate may be used to perform focusing along the optical axis. More specifically, a laser beam to which the photosensitivity of the resist is low is provided for focus detection and is introduced into the projection optical system from the outside of the pattern region of the reticle to be led to a central portion of the shot region on the wafer by a deflecting member such as a diffraction grating on the aperture plate. A laser beam thereby reflected by the wafer is further led to the deflecting member to an external optical system. Since the laser beam led to the wafer is inclined relative to the optical axis, the position at which the reflected light is received is changed if the wafer is moved along the optical axis. It is therefore possible to perform focusing by monitoring the position of this reflected light.

The fourth embodiment will next be described below with reference to FIGS. 13A and 13B.

Figure 13A:
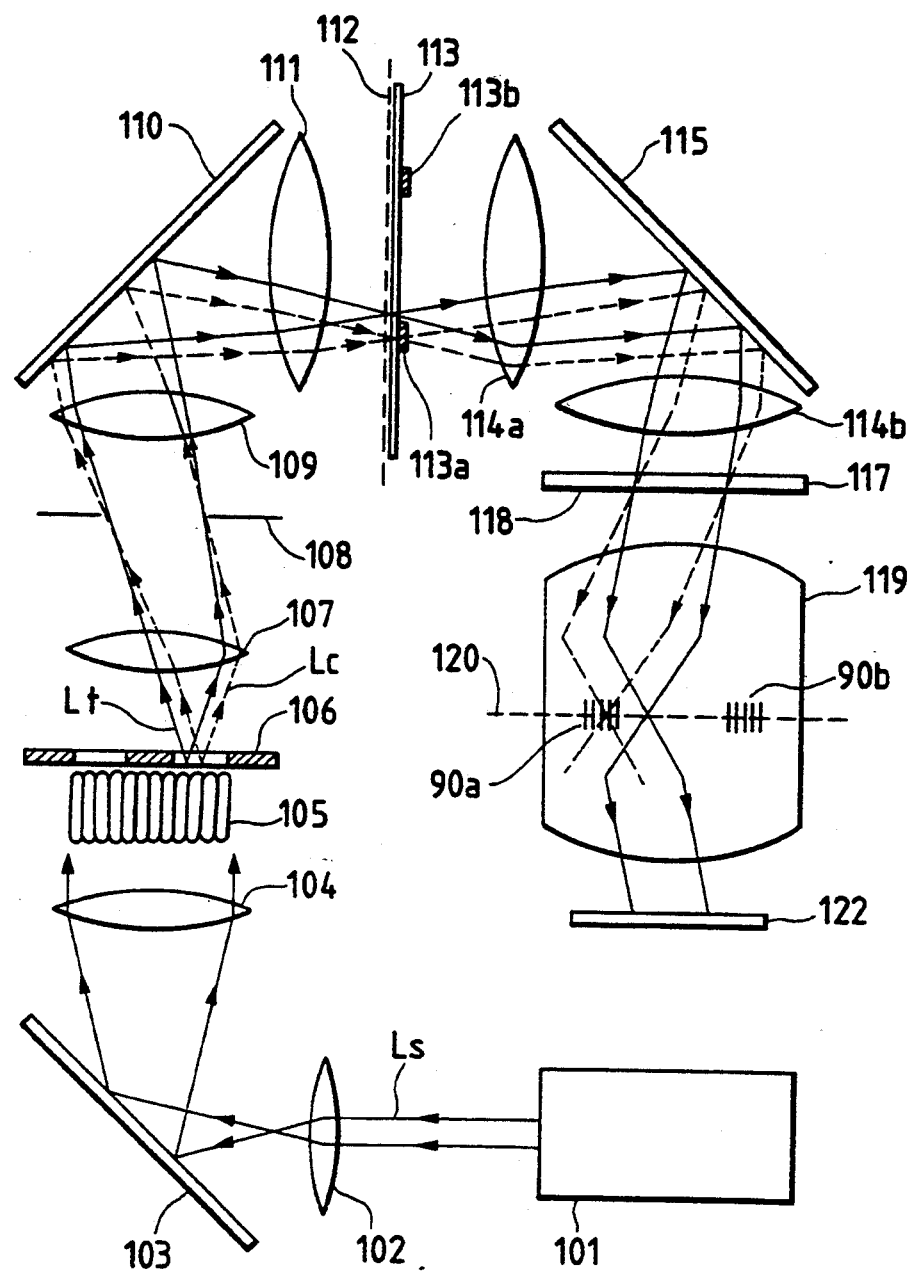
FIGS. 13A and 13B illustrate the overall structure and the alignment optical system of a fourth embodiment of the projection exposure apparatus according to the present invention.

FIG. 13A shows the overall construction of a projection exposure apparatus in accordance with this embodiment. An excimer laser is used as a light source 101 for exposure. However, the light source 101 is not limited to an excimer laser, and it may by a line lamp such as a mercury lamp or a different type of laser. Exposure light Ls emitted from the light source 101 is converted into a bundle of generally parallel rays by a condenser lens 102, a mirror 103 and an input lens 104 to be incident upon a fly-eye lens 105. The rear (i.e., reticle-side) focal plane of the fly-eye lens 105 is generally in an optical Fourier transformation relationship with a pattern 118 formed on a reticle 117 described later. An aperture stop 106 is provided at this rear focal plane.

Passing through the aperture stop 106, the exposure light Ls is led to the reticle 117 via a relay lens 107, a field stop 108, a relay lens 109, a mirror 110, a relay lens 111, a condenser lens 114a, a dichroic mirror 115, a condenser lens 114b. The reticle pattern 118 is formed on a lower surface of the reticle 117. Surfaces of the field stop 108 and the reticle pattern 118 are conjugate with respect to the exposure light LS, and the illumination field can be controlled with the field stop 108. The aperture stop 106 serves to determine the angle and the direction of incidence of the exposure light Ls upon the reticle pattern 118.

A transparent substrate 113 is interposed between the relay lens 111 and the condenser lens 114a. Two shielding members 113a and 113b are attached to the transparent substrate 113 at predetermined positions. The transparent substrate 113 is formed of, for example, a material (quartz or the like) having a transmittance approximately equal to 100% with respect to the exposure light, and the shielding members 113a and 113b are formed of a light shielding material such as a metal on the transparent substrate 113. If the material of the shielding members 113a and 113b is a material absorptive of light, it may be damaged by the heat received by absorbing the exposure light. It is therefore preferable to select a material having a high reflectivity as the shielding member material.

The reticle pattern 118 in the exposure light Ls is imaged on an exposure surface of a wafer 122 through a projection optical system 119. Two diffraction gratings 90a and 90b are locally provided in the projection optical system 119. The diffraction gratings 90a and 90b are disposed on a plane 120 which is an optical Fourier-transformed equivalent to the reticle pattern surface 118 in the exposure light in the projection optical system 119. The transparent substrate 113 to which the shielding members 113a and 113b is disposed on a plane 112 which is another optical Fourier-transformed equivalent to the reticle pattern surface 118. That is, the plane 112 on which the transparent substrate 113 is disposed is conjugate with the plane on which the aperture stop 106 is disposed and the plane 120 in the projection optical system 119 on which the the diffraction gratings 90a and 90b are disposed. The shielding members 113a and 113b are disposed in positions conjugate with those of the diffraction gratings 90a and 90b with respect to the exposure light. Also, the size of the shielding members 113a and 113b is selected so as to be slightly greater than that of the diffraction gratings 90a and 90b by considering the projection magnification.

Figure 13B:
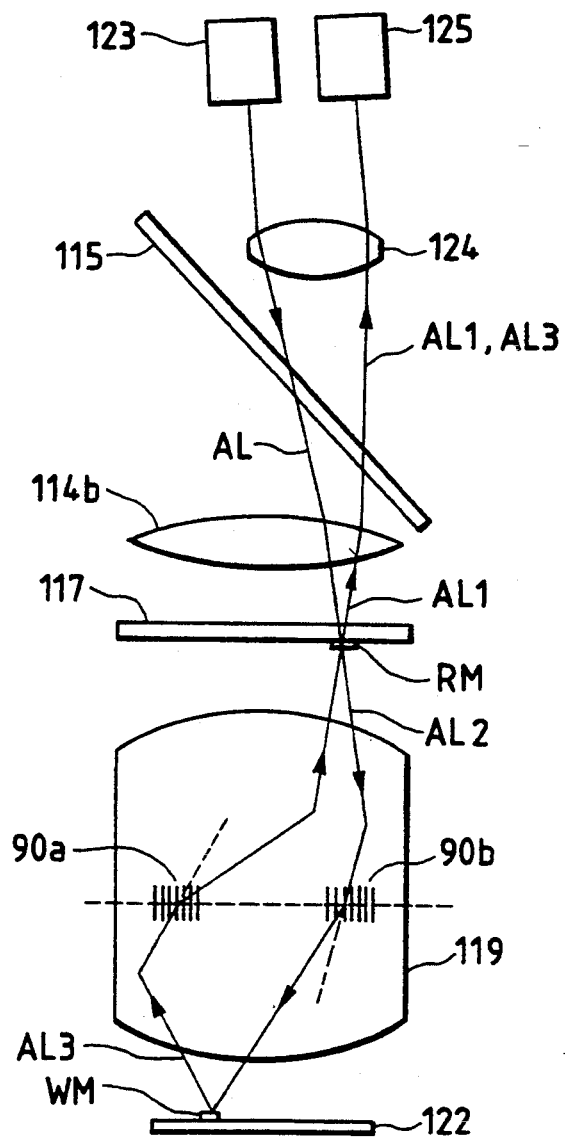

FIG. 13B shows a TTR type alignment optical system. As alignment light AL, light to which the photosensitivity of the resist on the wafer 122 is low, e.g., He-Ne laser light having a wavelength of 633 nm, is used. In this embodiment, the alignment optical system, i.e., a light source 123, an objective lens 124 and an image pickup element 125 are disposed above the dichroic mirror 115. The dichroic mirror 115 has optical characteristics such as to reflect 90% or more of the exposure light and to transmit 50% or more of the alignment light AL.

The alignment light emitted from the light source 123 is led to a reticle mark RM on the reticle 117 through the objective lens 124, the dichroic mirror 115 and the condenser lens 114b. Reflected light AL1 from the reticle mark RM travels through the condenser lens 14b, the dichroic mirror 15 and the objective lens 124 to be converged at a light receiving surface of the image pickup element 125, so that the reticle mark RM is imaged on an imaging surface of the image pickup element 125. On the other hand, alignment light AL2 passing the reticle mark RM is deflected by the diffraction grating 90b in the projection optical system 119 to irradiate a wafer mark WM on the wafer 122. Reflected light AL3 from the wafer mark WM is deflected by the diffraction grating 90a in the projection optical system 119, passes in the vicinity of the reticle mark RM and is thereafter converged at the light receiving surface of the image pickup element 125 through the condenser lens 114, the dichroic mirror 115 and the objective lens 124, so that the wafer mark WM is imaged on the imaging surface of the image pickup element 125. The image of the reticle mark RM and the image of the wafer mark WM are thereby simultaneously formed on the light receiving surface of the image pickup element 12, thereby enabling the positional relationship between these marks to be measured by image processing.

In FIG. 13A, only rays passing through a right portion of the aperture of the aperture stop 106 among the rays of exposure light Ls emergent from the fly-eye lens 105 is shown. Rays Lt indicated by the solid line and rays Lc indicated by the broken line have different positions on the emergence side of the fly-eye lens 105.

As shown in FIG. 13A, the local diffraction gratings 90a and 90b are placed on the optical Fourier transformation equivalent surface 120 with respect to the reticle pattern 118. Therefore, a plane in the illumination optical system conjugate with the plane 120 in the illumination optical system is also a Fourier transformation equivalent plane with respect to the reticle pattern 118. Further, the shielding member 113a and the diffraction grating 90a are in an imaging relationship (conjugate), and the shielding member 113b and the diffraction grating 90b are also in an imaging relationship (conjugate).

Rays Lt and Lc in the exposure light emergent from the fly-eye lens 105 travel travel through the illumination optical system, and rays Lc are cut by the shielding member 113a. Imaginary optical paths after cutting rays Lc are also illustrated in FIG. 13A. Imaginarily, they are converged at the diffraction grating 90a. However, rays Lc are actually cut by the shielding member 113a as mentioned above, and the diffraction grating 90a is not irradiated with the exposure light.

In the arrangement shown in FIG. 13A, the shielding members 113a and 113b are disposed along the plane 112 with the relay lenses 107, 109, and 111 interposed between the emergence side of the fly-eye lens 105 and the shielding members 113a and 113b. However, the same effect can be achieved in a case where the shielding members 113a and 113b are provided along a plane on the emergence side of the fly-eye lens 105.

In the arrangement shown in FIG. 13A, the diffraction gratings 90a and 90b are disposed in the Fourier transformation equivalent plane 120 of the reticle pattern 118, but they may be disposed at other positions. However, it is desirable that the shielding members at the plane conjugate with the plane in which the diffraction gratings 90a and 90b are disposed are located in the vicinity of the Fourier transformation equivalent plane 112 with respect to the reticle pattern 18 in the illumination optical system (or in the vicinity of the emergence-side surface of the fly-eye lens 105). This is because if the shielding members 113a and 113b are shifted from this plane, there is a possibility of occurrence of a bad influence upon the illuminance uniformity of the exposure light on the reticle 117. Accordingly, from the conjugate relationship between the diffraction gratings 90a and 90b and the shielding members 113a and 113b, it is also desirable that the diffraction gratings 90a and 90b are located in the vicinity of the Fourier transformation equivalent plane 120 with respect to the reticle pattern 118.

While two diffraction gratings are provided in the projection optical system 119 shown in FIG. 13A, further two diffraction gratings may be provided, for example, in such a manner as to be located on the opposite sides of the optical axis in the direction perpendicular to the paper of FIG. 1. In this case, corresponding two shielding members are formed on the transparent substrate 113. Also, prisms may be disposed instead of the diffraction gratings 90a and 90b to deflect the alignment light. It is not always necessary for the shielding members 113a and 113b to completely cut the exposure light; the shielding members 113a and 113b may only reduce (attenuate) the exposure light. Further, as in the above-described first to third embodiments, dichroic films for cutting the exposure light may be formed on the transparent substrate on the reticle side where the diffraction gratings 90a and 90b are formed.

Further, the shape of the light source (two-dimensional light source) can be changed variously by interchanging the aperture stop 106. As mentioned above, the aperture stop 106 is in a conjugate relationship with he plane 120 in the projection optical system 119. Accordingly, the shape of the aperture stop is similarly projected onto the plane 120.

Figure 14A:
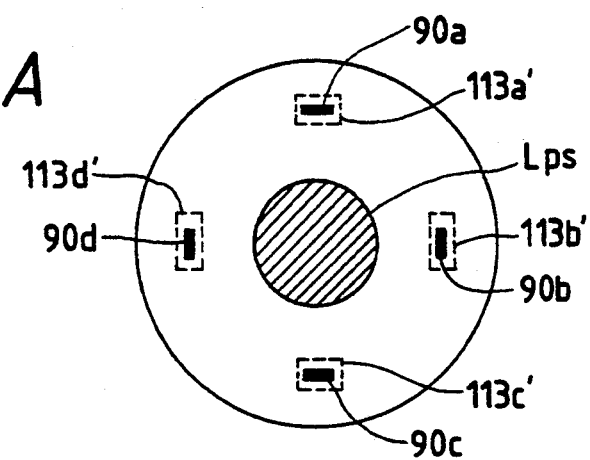
FIGS. 14A to 14C illustrate a variety of modifications of aperture diaphragm.
Figure 14B:
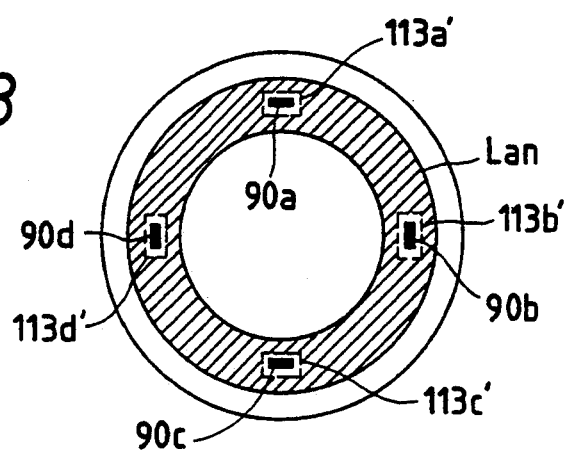
Figure 14C:
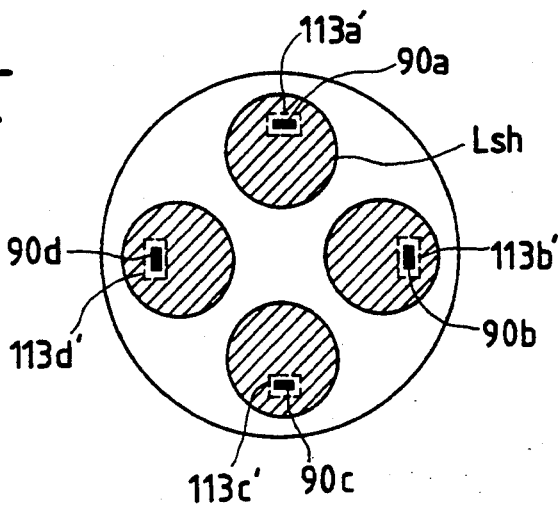

FIGS. 14A to 14C show various examples of the shape of the aperture stop as aperture stop images on the plane 120 of the projection optical system 119. The hatched portions in FIGS. 14A to 14C represent bright portions. FIG. 14A shows an image of an example of an aperture stop having a small σ value suitable of the phase shift method. In this case, exposure light is concentrated within a circle having 0.2 to 0.3 times as large as an external circle (corresponding to the aperture stop of the projection optical system 119.

In the following description, it is assumed that four diffraction gratings 90a to 90d are disposed in the projection optical system 119, and that four shielding members 113a to 113d are correspondingly attached to the transparent substrate 113. In the case of the example shown in FIG. 14A, the diffraction gratings 90a to 90d are not irradiated with exposure light Lps, but the positions of the diffraction gratings 90a to 90d are set within the areas of dark portions defined by images 113a' to 113d' of shielding members 113a to 113d. FIG. 14B shows an image of an example of an aperture stop in the case of annular zone illumination. Originally, diffraction gratings 90a to 90d can be irradiated with exposure light Lan. However, the positions of the diffraction gratings 90a to 90d are set within the areas of dark portions by the effect of images 113a' to 113d' of shielding members 113a to 113d, thereby preventing the diffraction gratings 90a to 90d from being irradiated with the exposure light.

FIG. 14C shows an example of the aperture stop image in the case of using a shaped light source. The areas of four circular bright portions are defined about the optical axis. In this case as well, images 113a' to 113d' of shielding members 113a to 113d prevent diffraction gratings 90a to 90d from being irradiated with exposure light.

The extent of the illumination beam in the plane at which the shielding members 113a to 113d are attached is sufficiently large in comparison with sectional area of the shielding members 113a to 113d. There is therefore no possibility of the amount of illumination light being considerably reduced by the addition of the shielding members 113a to 113d.

The method of forming various shapes of the light source by adding the aperture stop 106 the after the emergence from the fly-eye lens 105 has been described. Alternatively, a polyhedral prism, fibers, a polyhedral mirror or the like may be used to split the illumination light to form a light source having a desired shape. In this case, however, splitting or the like of the light beam is performed on the light source side of the shielding members 113a to 113b.

In the arrangement shown in FIG. 13A, one fly-eye lens 105 is provided to constitute an optical integrator. Alternatively, two fly-eye lenses may be arranged in the direction along the optical axis (in the direction of traveling of the light beam) to form a two-stage optical integrator.

In the above-described embodiment, the aperture stop 106, i.e., a spatial filter having a predetermined shape, is disposed in the vicinity of the emergence end of the fly-eye lens 105 (focal plane on the reticle side) to limit the light quantity distribution of the illumination light Ls in the Fourier transformation plane with respect to the pattern surface of the reticle 117 in the exposure illumination optical system (101 to 115) or in a plane in the vicinity thereof, for example, to an annular region or a plurality of local regions having centers at discrete positions deviated from the optical axis (positions at generally equal distances from the optical axis) according to the periodicity and the degree of fineness (pitch, line width and so on) of the reticle pattern, thereby enabling special illumination for the reticle pattern (annular zone illumination, oblique illumination or the like). When the value σ of the exposure illumination optical system is changed, the aperture of the aperture stop 106 as a spatial filter is also changed. Accordingly, at the time of special illumination, if the value σ is changed, in particular, to a small value, the number of substantial secondary light sources at the Fourier transformation plane is reduced, so that the illuminance uniformity over the reticle 117 or the wafer 122 is lowered.

To cope with this problem, the fly-eye lens 105 may be formed so as to have finer elements (having a smaller sectional area), or another fly-eye lens (which may be a rod type integrator) may be disposed on the light source side of the fly-eye lens 105 in such a manner that the emergence surface (reticle-side focal plane) of the first-stage (light source side) fly-eye lens corresponds to a Fourier transformed surface of the incidence surface of the second-stage fly-eye lens. Alternatively, an arrangement such as that shown in FIG. 15A may be adopted to superpose a plurality of parallel rays at the incidence surface of the fly-eye lens 105.

Figure 15A:
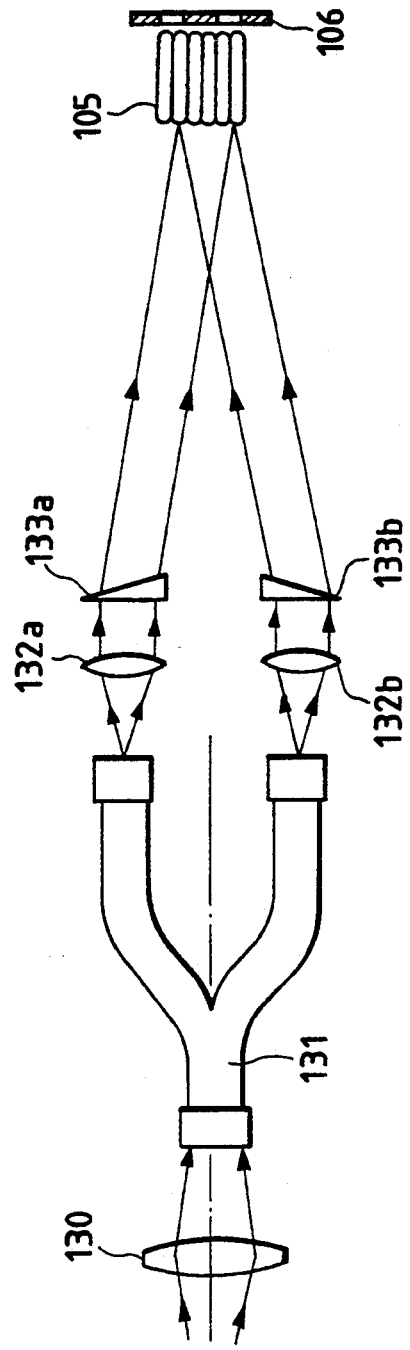
FIGS. 15A to 15C are structural views which illustrate a modification of the optical system in the vicinity of the flyeye lens shown in FIG. 13.
Figure 15C:
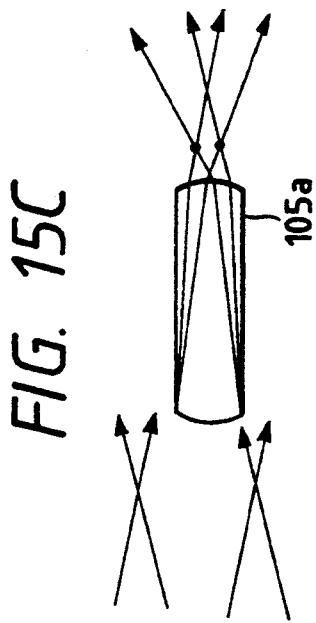
Figure 15B:
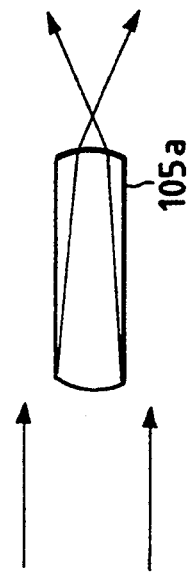

Referring to FIG. 15A, exposure light from the light source is is incident upon an input end of a one-input multi-output light guide 131, and a plurality of rays of exposure light are emitted from a plurality of output ends of the light guide 131. A first beam of exposure light travels through a condenser lens 132a and a wedge prism 133a to irradiate the incidence surface of the fly-eye lens 105 obliquely with respect to the optical axis and, and a second beam of exposure light travels through a condenser lens 132b and a wedge prism 133b to illuminate the incidence surface of the fly-eye lens 105 in an opposite direction with respect to the optical axis. Also, other beams of exposure light are led to illuminate the incidence surface of the fly-eye lens 105 in a superposing manner. In a case where each element of the fly-eye lens 105 is illuminated with only one parallel rays as shown in FIG. 15B, only one secondary light source is formed in correspondence with each element. In contrast, in a case where each element of the fly-eye lens 105 is illuminated with two bundles of parallel rays not parallel to each other as shown in FIG. 15C, two secondary light sources are formed correspondingly.

Consequently, if the illumination optical system shown in FIG. 15A is used, the number of secondary light sources formed in the vicinity of the emergence surface of the fly-eye lens 105 is increased, so that the illuminance uniformity over the reticle 117 or the wafer 122 is improved. The arrangement shown in FIG. 15A is only illustrative of this kind of illumination system. For example, other optical members, such as mirrors and beam splitters or the like, may be used instead of the light guide 131 and the wedge prisms 132.

In the optical system shown in FIG. 13B, alignment light is supplied from the reticle 117 side. However, the present invention can be applied to an arrangement in which alignment light is supplied from the wafer stage on which the wafer 122 is placed. For example, if a reference mark for reticle alignment is provided on the wafer stage, a corresponding alignment mark is also formed on the reticle 117. When the reference mark is illuminated from below with alignment light led into the wafer stage through optical fibers or the like, the reference mark is imaged on the pattern formation surface of the reticle 117. It is possible to measure the position of the reticle 117 by observing the positional relationship between the image of the reference mark and the mark on the reticle 117. In this case as well, it is possible to prevent the damage of the alignment light deflecting members in the projection optical system 119 caused by the exposure light, if a member for cutting the exposure light is disposed in the exposure light illumination optical system. As the TTR type alignment optical system shown in FIG. 13B, the same alignment optical system as that of the first embodiment (FIGS. 1 and 2) may be used.

Figure 16:
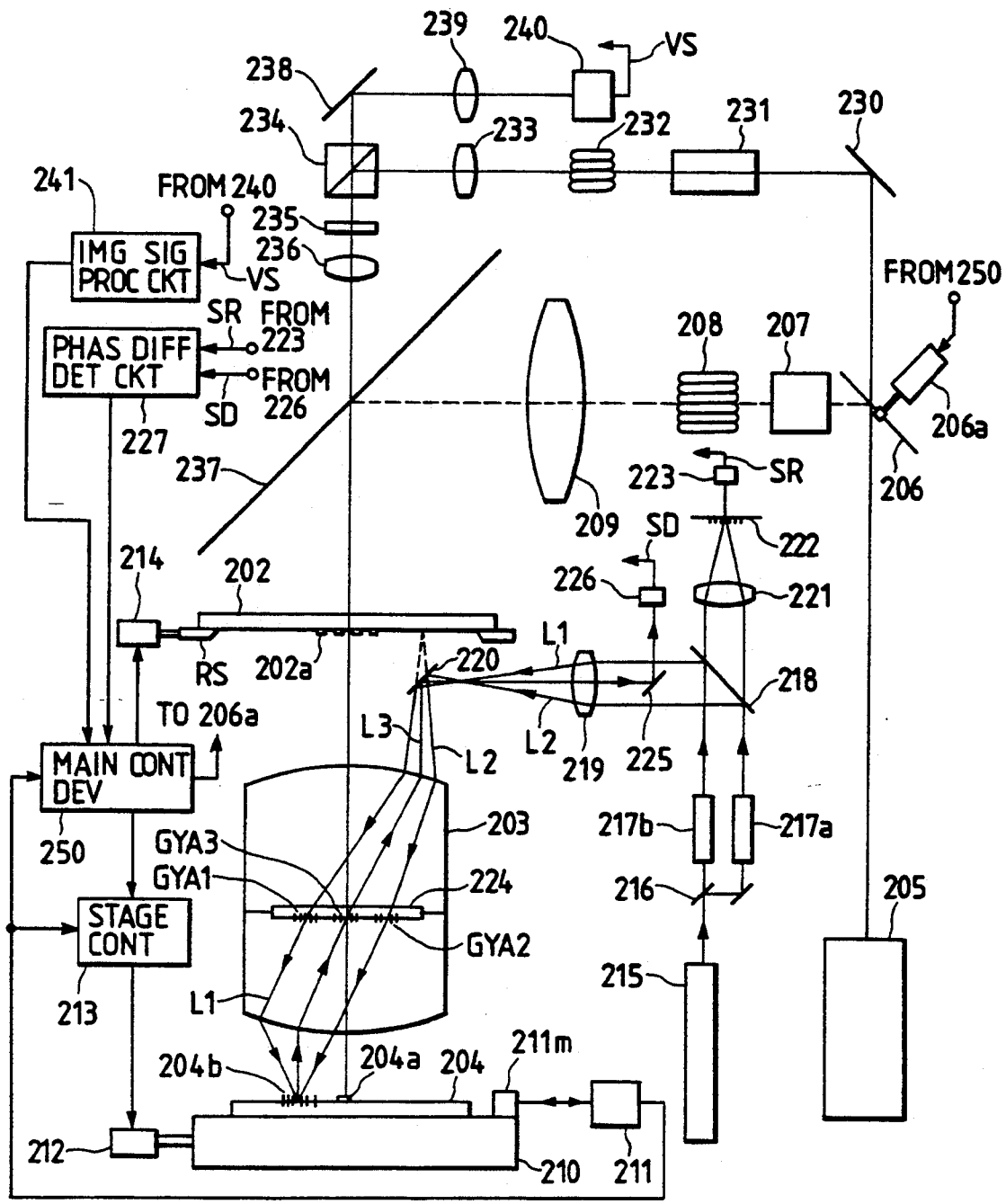
FIG. 16 illustrates the overall structure of a fifth embodiment of the projection exposure apparatus according to the present invehtion.

The fifth embodiment of the present invention will be described below with reference to FIG. 16. FIG. 16 shows the overall construction of the fifth embodiment. The path for excimer laser light emitted from an excimer laser light source 205 is changed by a changeover mirror 206 between an exposure illumination optical system (207 to 209) and an alignment illumination optical system (230 to 236). As shown in FIG. 16, excimer laser light reflected by the changeover mirror 206 capable of being driven by a motor 206a is led to a fly-eye lens 208 through a beam shaping optical system 207. Spots of light formed at an emergence-side focal plane of the fly-eye lens 208 are superposed by a condenser lens 209 to uniformly illuminate a reticle 202 via a mirror 237.

The reticle 202 is placed on a reticle stage RS which can be two-dimensionally moved by a motor 14.

A predetermined circuit pattern formed on the reticle 202 by a projection optical system 203 is projected and transferred to a wafer 204 to which a resist has been applied.

The projection optical system 203 is arranged so as to be telecentric on both the reticle 202 side and the wafer 204 side and to suitably correct chromatic aberrations of excimer laser light used as exposure light.

Circuit patterns which are formed by a preceding step and on which the circuit pattern formed on the reticle 202 is to be superposed (shot regions) and alignment marks 204a and 204b are formed on the wafer 204.

The wafer 204 is fixedly supported by suction means on the wafer stage 210 two-dimensionally movable in accordance with the step-and-repeat method. When the transfer exposure with the reticle with respect to one shot region on the wafer 204 is completed, the wafer 204 is moved in a stepping manner to the next shot position.

A stage controller 213 serves to position the wafer stage 210 at the desired position according to a command value form a main controller 250 by supplying a predetermined drive command to a motor 212 based on a position signal from a laser light wave interference type length measuring machine 211.

A moving mirror 211m is fixed on an end portion of the wafer stage 210. The moving mirror reflects a laser beam emitted from the laser light wave interference type length measuring machine 211.

The main controller 250 controls the position of the reticle stage RS or the wafer stage 210 based on detection signals (misalignment information) from first and second alignment optical systems described below, changes the exposure operation and the alignment operation, and effects overall control of the apparatus.

The projection exposure apparatus of this embodiment has a first alignment optical system using alignment light having the same wavelength as the exposure light and a second alignment optical system using alignment light having a wavelength different from that of the exposure light. In the second alignment optical system, laser light emitted from a laser light source 215 is split into light beams L1 and L2 by a beam splitter 216. These light beams are led to acoustooptic modulators 217a and 217b.

The construction and so on of the same optical system as the second alignment system of this embodiment is disclosed in Ser. No. 505,504 (Apr. 6, 1990). Therefore the construction of the second alignment system will be briefly described below.

The laser light source 215 emits 633 nm He-Ne laser light as illumination light having a wavelength different from that of the exposure light.

The acoustooptic modulators (AOM) 217a and 217b are driven with high-frequency signals to output respective light beams while frequency-modulating the same at frequencies of $f_0+f_1$, and $f_0+f_2$. $f_0$ is the frequency of the original He-Ne laser and $f_1$ and $f_2$ are the frequencies of the signals for driving the acoustooptic modulators 217a and 217b.

In the second alignment optical system, two light beams L1 and L2 having different frequencies are separated into transmission light and reflected light by a half mirror 218. The light beams reflected by the half mirror 218 travel through a relay lens 219 to intersect each other at a wafer conjugate plane and are introduced into the projection optical system 203 by a mirror 220.

The two light beams transmitted through the half mirror 218 travel through a relay lens 221 to intersect at a focal plane thereof. At the focal plane of the relay lens 221, a reference diffraction grating 222 formed at a predetermined pitch (e.g., twice as large as that of interference fringes formed by the light beams L1 and L2) in the direction along the paper of FIG. 16 is disposed.

Interference fringes flowing at a predetermined speed are formed on the reference diffraction grating 222 by the two light beams L1 and L2, and +1-order and −1-order diffracted light of light beams L1 and L2 are generated generally in the same direction. Interference light thereof is detected by a photoelectric detector 223.

A reference signal SR detected by the photodetector 3 is a sinusoidal alternating current signal (light beat signal) corresponding to cycles of brightness changes of the interference fringes formed on the diffraction grating 222.

Figure 18:
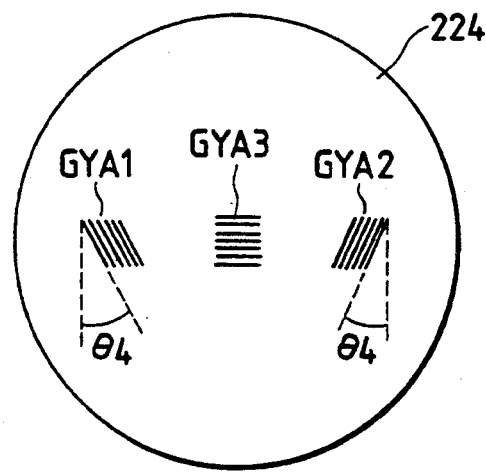
FIG. 18 is a plan view which illustrates diffraction gratings formed on the pupil surface of the projection optical system.

As shown in FIG. 18, a parallel flat plate 224 is disposed at the incidence pupil of the projection optical system 203 (i.e., at a plane in the projection optical system defined as a Fourier-transformed plane of the reticle pattern surface) or in the vicinity thereof, and diffraction gratings GYA1, GYA2, and GYA3 are provided on this plate.

The diffraction gratings GYA1 and GYA2 are set at positions where the two light beams L1 and L2 entering the projection optical system 203 pass. The light beams incident upon the diffraction grating are deflected in accordance with the grating pitch direction and the grating direction to irradiate the wafer 204 (i.e., the alignment mark 204b on a scribe line) (as described later in detail).

Figure 19:
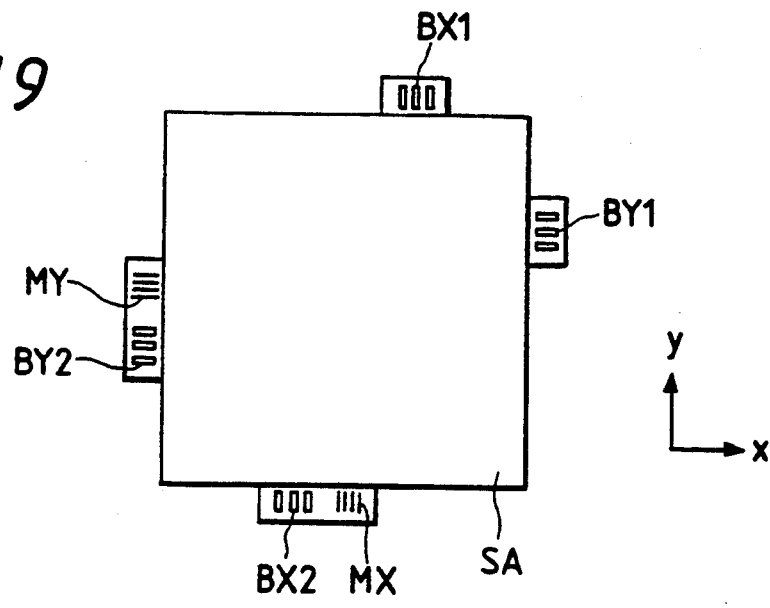
FIG. 19 is a plan view which illustrates a shot region on the wafer to be irradiated with exposure light.

Alignment marks BX1, BX2, BY1, BY2, MX, and MY, such as those shown in FIG. 19, are provided adjacent to the shot region SA. Two light beams diffracted by the diffraction gratings GYA1 and GYA2 (e.g., 1st-order diffracted light) intersect at the alignment mark 204b (corresponding to the mark MY shown in FIG. 19).

The marks MX and MY are formed in a predetermined positional relationship with the marks BX2 and BY2.

The alignment marks 204 are formed at such a pitch that the +1-order diffracted light and the −1-order diffracted light in each of the light beam L1 and L2 are directed substantially in the same direction which is, in the described embodiment, the direction of projection optical system 203, i.e., at a pitch which is twice as large the pitch of the interference fringe.

That is, the incident angle $\theta$ (crossing angle 28) of the two light beams is determined in accordance with the pitch of the mark 204 in such a manner that the diffracted lights of +1 and −1 orders are generated in the vertical direction, i.e., in the direction of the optical axis.

The reflected light beam L3 (diffracted lights of +1 and −1 orders) diffracted by the alignment marks is made to impinge again on the projection optical system 203 and is further diffracted by the diffraction grating GYA3 which is provided on the parallel flat plates and, after being reflected by the mirror 225 pat the mirror 220, introduced into the photoelectric detector 226.

The pohotoelectric detector 226 then produces a beat signal SD corresponding to the difference $f_1-f_2$ of the frequency between two light beams L1 and L2.

Consequently, the second alignment optical system detects the waveform phase difference between the reference signal SR detected by the photoelectric detector 223 of the phase difference detecting circuit 227 and the detection signal SD detected by the photoelectric detector 226 and delivered from the wafer. The phase difference ($\pm 180°$) initially corresponds to relative offset amount within $\pm P/4$ of the pitch P of the mark 204. It is therefore possible to detect the amount of relative offset of the wafer 204, by detecting the above-mentioned phase differential.

Namely, in the heterodyne type alignment system as described, the mark positions are determined on the basis of the interference fringe but on the basis of the time component (phase) caused by the high-speed movement of the interference fringe.

When this phase difference information has been obtained, the main control device 250 disconnects the laser light wave interference length measuring device 211 from the servo system for the wafer stage 210, and reduces the voltage applied o the motor 212 of the wafer stage 210 to zero. The main control device 250 then applies this voltage to the servo system associated with the stage RS carrying the reticle.

As will be described later, in the illustrated embodiment, the relative positional offset between the projected reticle image and one shot region on the wafer is substantially nullified by fine adjustment of position of the reticle or the wafer with the assist of the first alignment optical system (230-236, 238-240) and, thereafter, the amount of positional offset of the wafer (mark 204) is detected by using the second alignment optical system.

During the pattern exposure, the position information given by the laser wave interference length measuring device 211 is not utilized. Namely, the control is conducted on the basis of the position offset information derived from the second alignment system and, when the positional offset is reduced substantially to zero, the reticle stage RS is servo-controlled in accordance with the amount of variation of the positional offset value output from the second alignment optical system.

The servo control of the wafer stage 210 may be conducted when the positional offset between the projected image and the shot region has been reduced substantially to zero, in such a manner that the amount of positional offset detected by the second alignment optical system is maintained constant throughout the period of pattern exposure.

The second alignment optical system has an advantage in that, since two light beams L1 and L2 are substantially common in the portion which is exposed to moving atmospheric air, any undesirable effect of variation in the refractive index of the air is suppressed.

In the apparatus having the described arrangement, the servo control is not conducted on the basis of the value measured by the laser light wave interference length measuring device so that it is possible to reduce fine oscillation of the stage which otherwise may occur due to oscillation of air in the beam path of the interference meter.

In particular, minute oscillation of the wafer stage 210 and associated parts is suppressed and changed into a gentle drifting minute movement. Therefore, by performing high-speed follow-up control of the reticle stage, it is possible to maintain the relative positional offset between the reticle 202 and the wafer 204 substantially at zero.

It is therefore possible to achieve transfer of the circuit pattern with a high degree of fidelity, i.e., without causing thickening of the circuit pattern line or degradation in the resolution.

Although the alignment mark 204 is disposed inside the scribe line, the diffraction gratings GYA1 to GYA3 are disposed in the path of light of the second alignment optical system, in particular in the vicinity of the pupil surface of the projection optical system. It is therefore possible to arrange such that the mirror 220 is disposed outside the exposure region of the reticle 202. In other words, the exposure light which has been transmitted through the reticle 202 and which impinges upon the optical system 203 is never interrupted by the mirror 220. Therefore, the second alignment optical system, which employs illuminating light of wavelength region different from the exposure light (i-ray, j-ray or KrF Excimer laser), can continuously asure he position of the mark 204b, i.e., the position of the wafer 204.

The arrangement shown in FIG. 16 employs only one set of the second alignment optical system Actually, however, there is another set of the second alignment optical system and the amount of positional offset can be detected both in X- and Y-directions by the cooperation of these two second alignment optical system.

Furthermore, any demand for detection of rotational positional offset can be met by providing an additional one set of the second alignment optical system which is capable of detecting a lattice mark formed at a position facing the mark MX or the mark MY.

In the case of the projection exposure device shown in FIG. 16, the alignment marks 204 are arrayed in the m direction (meridional direction). This arrangement, however, is employed for the purpose of simplification of the explanation. Practically, it is more convenient that the alignment marks 204 are arranged in s direction (sagital direction). A description will now be given of the case where the marks to be detected are arrayed in the s direction, with specific reference to FIGS. 17A and 17B.

Figure 17A:
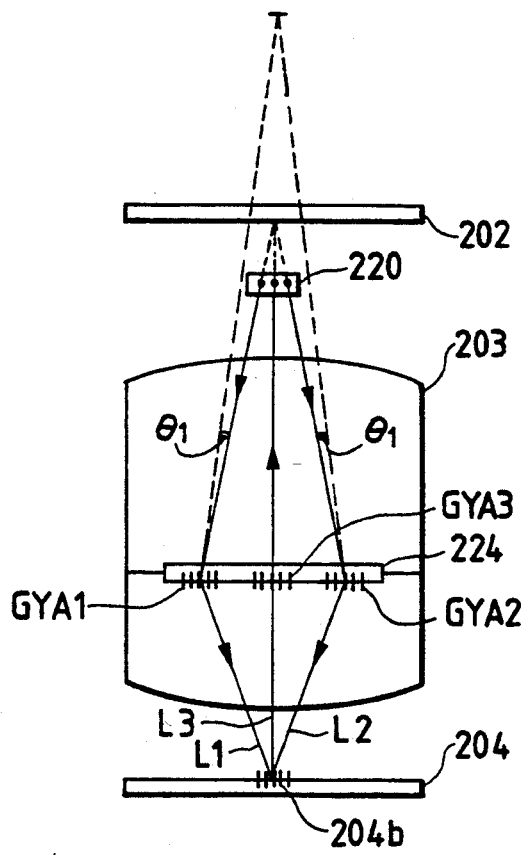
FIGS. 17A and 17B illustrate the optical path of a second alignment optical system.
Figure 17B:
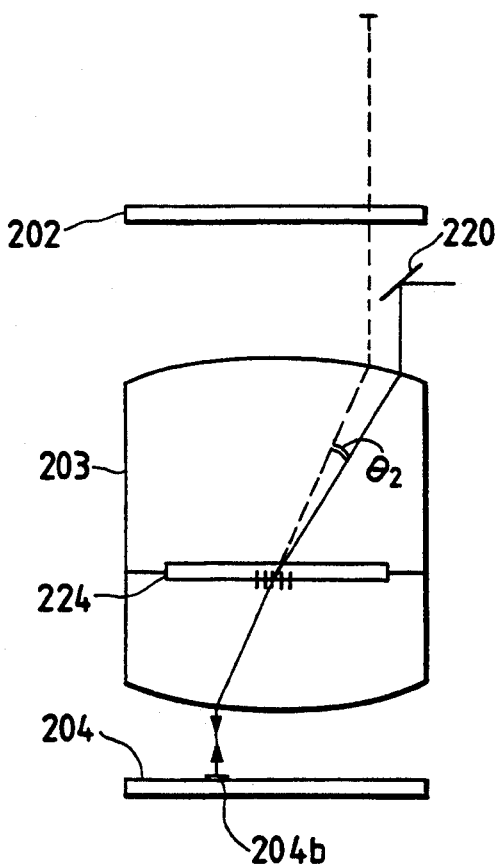

FIG. 17A is a view taken along the sagital plane, while FIG. 17B is a view taken along meridional plane. Diffraction gratings GYA1 to GYA3 provided on the parallel flat plate 224 on the incident pupil ar adapted o deflect the illuminating light beams L1, L2 and the detection beam L3 by angles $\theta 1$, $\theta 2$ and $\theta 2$, respectively, as in the preceding case.

Deflection of the illuminating light beams L1, L2 by the angles $\theta 1$, $\theta 2$ are required both in the sagittal plane and the meridional plane. The diffraction gratings GYA1 and GYA2 as the illuminating light compensating optical devices are arranged in the direction of measurement so as to be directed in opposite directions across the center of he pupil, and are inclined at an angle $\theta 4$.

The diffraction gratings GYA1 and GYA2 are adapted to deflect the illuminating light beams L1 and L2 at a correction angle of $\theta 1$, so as to substantially compensate for the axial color aberration $\Delta L$ on the optical axis of the projection optical system 203. At the same time, in order to compensate for chromatic aberration of magnification $\Delta T$ of the projection optical system 203 or to excessively correct the same, illuminating light beams L1 and L2 are deflected by a correction angle $\theta 2$ in the direction perpendicular to the measuring direction, i.e., in the meridional plane, as shown in FIGS. 17A, 17B and 18.

The diffraction grating GYA3 as the detected light correction element is formed on the pupil center so as to have a pitch in the non-measuring direction.

That is, the diffraction grating GYA3 which functions as the detected light correction optical element is arranged such that the detected light L3 is deflected by the correction angle $\theta 2$ in the meridional direction, so as to compensate for the chromatic aberration of magnification of he projection optical system 203 or to excessively correct the same.

The following relationships exist between the correction angle and the pitches of the diffraction gratings:

$$\tan \theta 4 = \sin \theta 2 / \sin \theta 1 \tag{1}$$

$$PYA3 = k \cdot \lambda / \sin \theta 2 \tag{2}$$

$$PYA1 = PYA2 = (k \cdot \lambda / \sin \theta 1) \sin \theta 4 \tag{3}$$

wherein PYA1, PYA2 and PYA3 indicate the pitches of the diffraction gratings GYA1, GYA2 and GYA3, $\lambda$ indicates the wavelength $\theta$ the alignment light, and $\theta 4$ indicates the angle at which the diffraction gratings GYA1 and GYA2 are inclined with respect to the direction Y, while k indicates a constant.

The correction angle $\theta 1$ is determined to bean angle which substantially compensates for the axial chromatic aberration $\Delta L$, while the correction angle $\theta 2$ is determined according to the position of the mirror 220.

The second alignment optical system having the described construction is capable of performing detection only in sagital direction. In the practical system, therefore, it is necessary to perform detection both in x- and y-axis directions Therefore, two sets of alignment marks 204b of the wafer 204 are provided on the x- and y-axes of the scribe line on the wafer 204, as indicated by MX and MY in FIG. 19.

The area SA surrounded by the solid line is the shot region which is shot in a single step of exposure. The alignment marks MX and MY are protected so as not to be broken by the process. When the marks are formed by photoresists, they are protected by being masked.

The aligning position may be changed when the size of the shot region is changed or when the alignment marks are to be renewed. In such a case, therefore, it is necessary that the alignment optical systems are moved.

The incident positions of the illuminating light beams L1, L2 and the detection light beam L3 on the pupil are not changed even when the alignment optical systems are moved as described above, although angles of incidence of the lights are changed. Therefore, the size of the diffraction grating on the pupil can be minimized.

The diffraction gratings GYA1 to GAY3, which are provided on the parallel flat plate 224, may be realized by forming phase gratings by etching glass sheets or by forming films of, for example, $SiO_2$.

The step height d of the phase diffraction grating is preferably determined to meet the condition of the following formula (4), in order to attain a high diffraction efficiency:

$$d = k \cdot \lambda / 2(n-1) \quad (4)$$

wherein k is an integer, n represents refractive index and $\lambda$ represents the alignment wavelength.

In this case, it is preferred to form a thin film such that the exposure light is reflected while the alignment light is transmitted as the diffraction grating, in order to eliminate the influence on the exposure wavelength. By reducing the area occupied by the diffraction grating while preventing transmission of the exposure light, it is possible to minimize any undesirable effect on the image formation.

From a theoretical point of view, correction of the axial chromatic aberration $\Delta L$ does not constitute any essential feature of the present invention. Practically, however, it is important to effect this correction, for the reasons stated hereinbelow.

Assuming here that the wavelength $\lambda$ of he exposure light is 248 (nm) (KrF excimer laser), while the wavelength $\lambda$ of the alignment light is 633 (nm) (He-Ne laser), the amount of the axial chromatic aberration $\Delta L$ is as large as 500 9 nm). Consequently, the mirror is required to have greater width, and possibility of occurrence of error is enhanced due to, for example, rotation of the mirror. Furthermore, the length of the light path through the air is increased so that oscillation between two light beams is enhanced, tending to allow generation of position error.

In contrast, the first alignment optical system (230–235, 238–240) using alignment light of the same frequency band as the exposure light is constructed such that, in the aligning operation, the excimer laser emitted from the excimer laser source 205 is reflected by the mirror 230 past the change over mirror 206 and is then introduced to the beam shaping device 231.

More specifically, the first alignment optical system is so arranged that the excimer laser beam which has passed the beam shaping optical system 231 is then made to pass through a fly-eye lens 232, a lens 233, a polarizing beam splitter 234, a quarter wavelength plate 235, an objective lens 236 and a half mirror 237, thereby uniformly illuminating a predetermined region of the surface of the reticle 202 including the alignment marks.

The excimer laser source 205 emits a linearly polarized beam and is made incident to the polarizing beam splitter 234 in such a direction that the beam is almost perfectly reflected.

The reflected light is then circular-polarized by the ¼ wavelength plate 235 so as to illuminate the reticle 202 or the wafer 204.

The alignment detection light returning from the wafer 204 or from the reticle 202 is then linearly polarized to a direction which is perpendicular to the original linearly polarized light, and substantially 100% of this linearly polarized light is transmitted through the polarized beam splitter 234.

With this arrangement, it is possible to separate the illuminating light and the returning detection light from each other while minimizing the loss of light.

The half mirror 237 receives both the exposure light from the illuminating optical system 207–209 and the alignment light (exposure light) from the first alignment optical system 230–236, 238–240. Consequently, the half mirror 237 is so designed as to exhibit a reflectivity of about 90% and a transmissivity of about 10% for the exposure light.

The reticle 202 and h wafer 204 are substantially conjugate with each other with respect to the projection optical system 203 under the exposure wavelength. Therefore, the alignment mark 202a on the reticle 202 and the alignment mark 204a on the wafer 204 are simultaneously observable and the images of these marks are formed on the imaging device 240 through the objective lens 236, and relaying optical systems 238, 239.

Video signals VS from the imaging device 240 is supplied to the video signal processing circuit 241 which computes the relative positional offset between the reticle 202, i.e., the marks 202a, and the wafer 204, i.e., the marks 204a.

Although FIG. 16 shows only one set of the first alignment optical system, a quadri-axis arrangement is adopted to cover also the positional offset in the rotational direction. To this end, four sets of wafer marks 204a, each being a convexed or concaved bar pattern, are arranged around the shot regions SA as represented by BX1 to BX2 and BY1 to BY2 in FIG. 19. At the same time, four sets of first alignment optical system are provided for detecting corresponding wafer marks 204a.

Figure 20A:
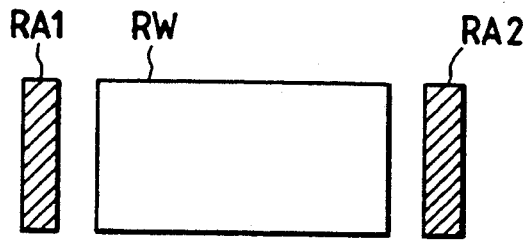
FIGS. 20A and 20B illustrate a position alignment operation to be performed by a first alignment optical system.

As shown in FIG. 20A, the wafer mark 204a can be observed through a window RW which is formed in a light-shielding zone (chromium layer) surrounding the pattern region of the reticle 202. The alignment mark 202a of the reticle 202 are gratings RA1 and RA2 which have a very small pitch not greater than the resolution limit and which are disposed adjacent to the window RW.

Since this small pitch is equals to the resolution limit of the projection optical system 203 at the greatest, the transmitted lights diffracted by the marks RA1,RA2 other than the diffracted light of 0-order exhibit large diffraction angles and, hence, do not impinge upon the projection optical system 203. Consequently, a reduce amount of light can reach the wafer 204.

When the light reflected by the wafer 204 illuminates the marks RA1, RA2 from the lower side, i.e., from the same side as the projection optical system 203, transmitted diffracted lights generated on the upper side, other than that of 0-order, is limited by the aperture number of the detection optical system, aperture number of the projection optical system in this case, so that they cannot reach the imaging device 240.

Therefore, the images of the alignment marks 202, i.e.. marks RA1 and RA2. detected by the imaging device 40 is obtained as dark belts of a substantially constant brightness lower than those of other portions of the reticle, substantially regardless of the reflectivity of the wafer 204 and the structure of the surface.

With this arrangement, it is possible to reduce the quantity of light returning from the wafer 204, so that the position of the reticle 202 can be detected without being influenced by the wafer 204.

Figure 20B:

Referring now to FIG. 20A, when the direction of scanning performed by the imaging device 240 is set to the same direction as the measurement, i.e., to the lateral direction as viewed in the Figure, the brightness distribution on the imaging surface is averaged in the non-measuring direction, provided that the device has a sufficiently large length in the non-measuring direction, i.e., in the vertical direction as viewed in the Figure. FIG. 20B shows the output signal derived from such a linear array device.

The resist covering the alignment marks BX-1, BX2 and BY1, BY2 on the wafer 204 may be peeled at the portions covering these marks so as to eliminate influence of the resists, so that the detection accuracy is further improved.

According to the described arrangement, when the wafer 204 is placed on the stage 210, the main control device 250 performs a rough positioning (pre-alignment) of the wafer operation of an off-axis alignment optical system (not shown) which is disposed outside the projection optical system. The main control device 250 further operates to cause a rotation of the reticle 202 through a very small angle so as to remove any residual rotational error of he wafer 204.

The main control device 250 then starts fine positioning and superposition exposure operation for each shot region, on the basis of the above-described pre-alignment and rotational alignment.

In this embodiment, a method known as die-by-die D/D) method is employed, in which alignment is effected for each of the shot regions.

The main control device 250 performs the control of the wafer stage 210 on the basis of the design coordinate values of the shot regions on the wafer 204 and in accordance with the position signals derived from the laser light wave interference length measuring device 211, so as to place the desired shot region in the exposure position beneath the projection optical system 203.

Then, the main control device 250 detects the phase signal from the second alignment optical system 215–226.

The second alignment optical system splits the He-Ne laser light emitted from the laser source 215 into two light beams by means of the beam splitter 216. These light beams are then frequency-modulated by means of acoustic-optical devices 217a, 217b.

The light beams L1, L2 after the modulation are reflected by the half mirror 218 and impinge upon parallel flat plates 224 (GYA1, GYA2) provide din the vicinity of the pupil plane of the projection optical system 203, via the relay lens 219 and the mirror 220, whereby the light beams L1, L2 are diffracted by the diffraction gratings GYA1 and GYA2. The diffracted light beams then irradiate the alignment marks 204 (mark MY) provided on the wafer 204.

A further operation of the main control device 250 causes the photoelectric detector 226 to detect the reflected light beam L3 reflected from the alignment mark 204, via the parallel flat plate 224 (diffraction grating GYA3), mirror 220, relay lens 219 and the mirror 225. The main control device 250 then operates to control the position of the wafer stage 210 in such a manner as to nullify the positional offset of the position of the alignment mark detected by the photoelectric detector 226 and the beat signal (reference signal SR) detected by the photoelectric detector 223.

Furthermore, when the alignment using the second alignment optical system (rough alignment) is finished, the main control device 250 performs switching of the control of position of the wafer stage 210 from the control mode which relies upon the laser light wave interference length measuring device 211 to the mode which relies upon the phase signal derived from the second alignment optical system.

The precision of the pre-alignment which is conducted in advance to the rough alignment performed by the second alignment optical system is high enough to set the alignment marks 204b to a range which is within $\pm P/4$, i.e., ¼ the pitch P of the alignment marks 204b.

Thereafter, the main control device 250 operates so as to drive the switching mirror 206 into such a state that the excimer laser from the laser source 205 is introduced to the first alignment optical system. Then, when the offset signal (phase signal) from the second alignment optical system has fallen to zero or in a predetermined range, the main control device 250 sends a trigger pulse to the excimer laser source 205, thereby activating the laser.

The excimer laser light then impinges upon the deflection beam splitter 234 pst the mirror 230, beam shaping optical system 231, fly eye lens 232 and the relay lens 233, so as to be reflected by the beam splitter 234.

The laser light then uniformly illuminates the alignment marks 202a on the reticle 202 and the alignment marks 204 on the wafer 204.

In the first alignment optical system, the lights reflected by the alignment marks on the reticle 202 and the wafer 204 are received by the imaging device 40, past the half mirror 237, objective lens 236, ¼ wavelength plate 235, deflection beam splitter 234, mirror 238 and the relay lens 239. Furthermore, the positional offset between the alignment marks 202a on the reticle 202, i e., marks AR1 and AR2, and the alignment marks 204a on the wafer 204, i.e., the mark MY, is detected by the processing circuit 241.

Based on the positional offset amount as the result of the measurement performed by the second alignment optical system, the wafer stage 210 is driven to effect the fine alignment. The fine alignment may be executed by driving the reticle stage RS by an amount determined in consideration of the magnification of the projection optical system 203. Consequently, the projected image of the reticle and the shot region are precisely overlapped.

After completion of the described operation, the main control device 250 switches the change over mirror 206 to to the illuminating optical systems 207–209 starting exposure of the shot region of the wafer 204 through the reticle pattern placed thereon. When the fine alignment is over, the main control device 250 detects the alignment marks 204b by using the second alignment optical system, an stores the phase difference of the beat signal SD from the reference signal SR as the initial difference value.

During the superposed exposure of the wafer, the main control device 250 continues to control the reticle stage RS (or the wafer stage), in accordance with the phase signal derived from the second alignment optical system, such that the phase signal (phase difference) obtained from the light beam L3 reflected from the alignment marks 204 on the wafer 204 is always maintained at the same level as the above-mentioned initial difference value.

As a result of the positioning operation performed with the second alignment optical system, it is possible to maintain the relative positional offset between the reticle 202 and the wafer 204 substantially at zero level throughout the period of the exposure. It is therefore possible to effect a transfer of image with a high degree of fidelity without being accompanied by detrimental effect such as thickening of lines or reduction in the resolution.

When the exposure is over on one shot region, the main control device 250 performs again the described operation, whereby the intended superposition exposure is conducted on all the shot regions on the wafer 204.

Thus, in the described embodiment of the present invention, a fine alignment is conducted prior to the exposure, by detecting the relative position of the wafer 204 with respect to the reticle 202, by using the first alignment optical system 230–236 and 238–240. Then, after the superposition exposure is commenced, the position of the reticle stage RS is continuously controlled so as to maintain the initial alignment between the reticle 202 and the wafer 204, by using the second alignment optical system 215–226. It is therefore possible to effect the exposure with higher degree of precision than conventional art.

Consequently, an alignment precision on the order of $|\overline{X}+3\sigma|\leq 20$ [nm] can be obtained, which is high enough to make the embodiment applicable to production of UVLSIs such as 64 DRAM or 256 MDRAM.

The embodiments described hereinbefore employs so-called heterodyne alignment system in which the marks to be examined are irradiated by two beams having different frequencies and applied in two different directions and the alignment is executed on the basis of the result of photoelectric detection of interference between two diffracted lights which are generated substantially in the same direction from the examined marks This, however, is not exclusive and the invention can also be applied to the case where the alignment is achieved by so-called homodyne alignment method in which a pair of beams of the same frequency are applied to the marks to be examined and the two diffracted lights from the marks ar made to interfere with each other, so that light intensity of the interference light varies depending on the position of the wafer, thus enabling the wafer to be aligned When the homodyne-type method is used, it is necessary to perform scanning of the interference fringes formed by two light beams and the marks to be examined in relation to each other, for otherwise the amount of positional offset cannot be detected. Namely, only the intensities of the diffracted lights can be detected when both the interference fringes and the marks are kept still. When the homodyne-type method is used, therefore, the aligning operation is conducted by effecting a servo control of the wafer stage 210 such that the output from the second alignment optical system is held constant when the amount of the positional offset between the reticle 202 and the wafer 204 is substantially nullified by the operation of the first alignment optical system.

It is also possible to employ a method other than the described heterodyne or homodyne type method. For instance, the alignment may be achieved by applying two light beams of different polarizations, e.g., P-polarized light and S-polarized light, to the marks and then receiving the diffracted lights from the marks through an analyzer.

In the described embodiment, the second alignment optical system is adapted to detect diffracted lights of ±1 orders. This, however, is only illustrative and the embodiment may be modified such that the second alignment optical system detects diffracted lights of 0-order and −2-order or diffracted lights of +2-order and 0-order.

It is also possible to use the TTL-type alignment optical system of the third embodiment as shown in FIG. 12.

It is also possible to use an image-processing type system as the second alignment system. Thus, any type of alignment system can be used which can detect the position of the wafer while he wafer stage is kept stationary.

The first alignment optical system can employ any suitable detection method and construction, provided that it makes use of the exposure light.

In the described embodiments the illuminating light compensation optical devices GYA1, GYA2 and the detection light compensation optical device GYA3 are separately disposed between the reticle 202 and the wafer 204 so as to independently act on the illumination lights L1, L2 and the detection light L3. This arrangement is not essential and the arrangement may be such as to detect interference lights which traces back the path of the two illuminating lights which are applied in two different directions to the marks to be examined.

In the embodiments described hereinbefore, the alignment marks are detected by alignment optical systems which are disposed to receive the lights reflected by the mirror 220 which is positioned between the reticle 202 and the optical system 203. According to the invention, however, it is also possible to perform the alignment by TTR method employing a mirror 220 disposed between the reticle 202 and the half mirror 237.

It is also to be understood that the diffraction gratings used as compensation optical devices for controlling the alignment light path composed of the illumination light path and the detection light path may be substituted by other types of optical elements such as minute prisms.

Furthermore, the compensation optical device as shown in FIG. 18 is only illustrative and the compensation optical device may function as a Fresnel zone system.

The use of compensation optical device may not be required in some types of projection optical system, depending on the chromatic aberration of magnification ΔT of the projection optical system 203. In the embodiment described above, the second alignment optical system is of TTL type, so that the compensation optical device is required only to compensate for at least the chromatic aberration of magnification. Compensation for axial chromatic aberration provides an advantage in that the length of the system can be reduced.

Although the described embodiments employ refractive optical systems as the projection optical system, this is only illustrative and the projection optical system may be composed of a reflective optical system or a combination of a refractive optical system and a reflective optical system.

Furthermore, the first alignment optical system employed in the described embodiments may be of open control type in which the reticle 202 or the wafer 204 is driven so as to nullify the positional offset between the reticle 202 and the wafer 204 or of close control type in which both the reticle 202 and the wafer 204 are monitored and one of the reticle 202 and the wafer 204 is moved in such a manner as to nullify the positional offset therebetween.

Thus, the alignment may be conducted either by computing the amount of positional offset or without requiring computation of the positional offset In the described embodiments, a rough alignment is performed prior to the correction of the relative positional offset between the reticle 202 and the wafer 204, by using a second alignment optical system in place of the leaser wave interference length measuring device 211 when the desired shot region has been brought to a position under the projection optical system. This process, however, is only illustrative and the invention can be carried out by employing a process in which a desired shot region in the pre-aligned shot region is introduced into the region under the projection optical system 203 in accordance with the design coordinate values, so that the alignment marks BX1, BX2, BY1, BY2 associated with the shot region are detected when the precision of the pre-alignment is sufficiently high.

In such a case, it is possible to omit the rough alignment of he wafer 204 performed by the second alignment optical system. Namely, the alignment may be conducted on the basis of the position signal derived from the laser wave interference length measuring device 211, in accordance with the design coordinate values, immediately followed by a fine alignment for aligning the reticle 202 and the wafer 204 relative to each other by using the first alignment optical system.

When such aligning method is employed, as in the case of the preceding embodiments, the amount of positional offset of the wafer 204 (phase difference between SD and SR in the illustrated embodiment) is detected as a reference value when the fine alignment performed by the fist alignment optical system is finished, and the wafer stage 210 is servo-controlled throughout the period of pattern exposure such that the positional offset amount (phase difference) detected by the second alignment optical system coincides with the above mentioned reference value.

When the reticle stage RS is finely moved during the pattern exposure, the reticle stag RS is servo-controlled in accordance with the value which is determined by taking into consideration the magnification of he projection optical system 203 and which corresponds to the difference between the value detected by the second alignment optical system and the reference value. By employing this method, it is possible to constantly maintain the positional offset between the reticle pattern projection image and the exposure region at zero level or within a predetermined allowable range of alignment precision.

Furthermore, although die-by-die (D/D) type exposure operation has been specifically described, this method is not exclusive and the same advantages as those described before can be obtained also when a so-called enhanced global alignment (EGA) method is employed as disclosed in U.S. Pat. No. 4,780,617.

The enhanced global alignment(EGA) method is a method in which coordinate values of a plurality of shot regions are measured from a preselected shot region in the wafer, and the wafer stage is moved in a stepped manner in accordance with the coordinate order of all the shot regions determined on the basis of a statistic computation from the measured coordinate values, whereby the projected image of the reticle pattern is exactly superposed on the desired shot region.

Practically, the exposure by the EGA method is conducted by determining, by using the first alignment optical system for example, the coordinate values of a plurality of shot regions on the wafer 204, i.e., the output values of the laser wave interference length measuring device 211 as obtained when the amount of positional offset between the reticle pattern and the shot region has been substantially nullified, and determining the coordinate order values of all the shot regions on the wafer through a statistic computation.

Then, the main control device operates to move the wafer stage 210 in accordance with the computed coordinate order values so as to bring the desired shot region to the exposure position When the EGA method is used, the positional misregistration between the reticle pattern and the shot region has been reduced substantially to zero. When the desired shot region has been located as described, therefore, it is possible to detect the alignment marks associated with this shot region by using the second alignment optical system.

Then, pattern exposure is conducted on the basis of the detected value (phase difference) by servo-controlling the reticle stage RS or the wafer stage 210 in accordance with the detection signal (phase difference information) provided by the second alignment optical system.

The embodiment described hereinbefore employs an operation which is called leveling operation in which the plane of the reticle pattern image formed by the projection optical system 203 is leveled with the plane of the shot regions prior to the exposure.

In this leveling operation, the wafer is inclined so as to obtain coincidence between the plane of the projected image and the plane of the shot region. Therefore, the shot region may be shifted within the X-Y plane in accordance with the inclination of the wafer 204, this causing a lateral misregistration.

This lateral misregistration tends to impair the precision of alignment. In the described embodiment, this problem is eliminated because the detection of the alignment marks is continued by using the second alignment optical system Namely, the amount of the above-mentioned lateral misregistration can be detected by conducting the leveling operation after switching from the mode in which the servo control signal for servo-controlling the reticle stage RS or the wafer stage 210 is derived from the laser wave interference length measuring device 211 to the mode in which the servo control signal is derived from the second alignment optical system.

It is therefore possible to prevent even the reduction in the alignment precision due to lateral misregistration, by finely adjusting, before commencing the exposure, the position of the reticle stage RS or the wafer stage 210 in such a manner as to substantially nullify the lateral misregistration by using the second optical alignment system.

Clearly, this method is advantageous particularly when the exposure is conducted by employing EGA method. When D/D type method is used, degradation of the alignment precision can be reduced by conducting the leveling operation during detection of the reticle 202 and the wafer 204 by the first alignment optical system.

In this case, the servo control of the reticle stage RS or the wafer stage 210 can be conducted by using the second alignment optical system after completion of the leveling operation.

The projection exposure apparatus of the described embodiment performs focusing operation, as well as the leveling operation. This, however, is not exclusive and the focusing may be conducted after switching from the mode in which the servo control signal for servo-controlling the reticle stage RS or the wafer stage 210 is derived from the laser wave interference length measuring device 211 to the mode in which the servo control signal is obtained from the second alignment optical system. This is because the foal depth of the second alignment optical system, corresponding to the area of the region where two light beams intersect each other, is large enough to cover any vertical displacement of the wafer 204, thus ensuring that the alignment marks are detected by the second alignment optical system.

In the embodiment described hereinbefore, different alignment marks are used for the detection by the first alignment optical system and the second alignment optical system, as shown in FIG. 19. Obviously, however, the arrangement may be such that the same alignment marks are commonly detected both by the first and second alignment optical systems.

Such an arrangement in one hand offers an advantage in that the area occupied by the marks on the wafer is reduced but, on the other hand, poses a problem in that the second alignment optical system also has to be movable when a renewal of alignment marks according to layers is necessary.

In the described embodiment, however, the second alignment optical system may be stationary because there is almost no risk for he alignment marks MX, MY to be broken, i.e., there is no necessity for renewal of the marks MX, MY, by virtue of the fact that the light employed in the second alignment optical system has a wavelength different from that of the exposure light.

In this regard, the first alignment optical system requires renewal of the alignment marks BX1, BY1, BX2, BY2. Therefore, the positional relationship between the alignment marks MX, MY and BX2, BY2 may vary according to the layer.

In the described embodiment, the alignment marks MX, MY for detection by the second alignment optical system are disposed adjacent to the alignment marks BX2, BY2 for detection by the first alignment optical system. The positional relationship between these two types of alignment marks, however, may be varied as desired provided that they are within the image field of the projection optical system 203.

Furthermore, since the first alignment optical system employs TTR type method, the alignment marks BX2 and BY2 have to be placed adjacent to the shot region SA. In contrast, the alignment marks MX, MY to be detected by the second alignment optical system need not be located adjacent to the shot region SA. In other words, the alignment marks MX, MY may be disposed anywhere on the wafer 204 provided that they are in a predetermined positional relationship to the alignment marks BX2 and BY2. This positional relationship may be varied according to the shot region.

In such a case, it is necessary that the second alignment optical system is of off-axis type. Therefore, it is necessary that the alignment marks MX, My are formed on the wafer 204 in such a positional relationship that corresponds to the positional relationship between the position of detection of the marks by the second alignment optical system and the exposure position where the reticle pattern is projected by the projection optical system 203, i.e., in a positional relationship corresponding to the baseline.

In the described embodiment, the servo control of the reticle stage RS or the wafer stage 210 during the exposure is performed on the basis of the signal from the second alignment optical system alone. The arrangement, however, may be such that a rotary shutter having four shutter blades is used in place of the switching mirror 206 shown in FIG. 16.

In such a case, the rotary shutter is rotated twice during the pattern exposure, each time through a predetermined angle (45°), in synchronization with oscillation trigger imparted to the excimer laser source 205, so that only several pulses of the light are applied to the first alignment optical system.

For instance, assuming that 50 pulses of light are necessary for the exposure of one shot, 25 pulses of the light are input to the illuminating optical system 207-209 and then the rotary shutter is rotated through 45° so that several pulses are received by the first alignment optical system. Then, the rotary shutter is rotated to allow the remainder 25 pulses to reach the illuminating optical system 207-209. By controlling the rotary shutter in the described manner in each exposure, it is possible to determine the positional misalignment between the reticle 20 and the wafer 204, by the use of the first alignment optical system, even during the exposure. It is to be understood that almost no reduction in the throughput is caused by adopting such a control sequence.

Accidental deviation of the reticle pattern from the shot region may occur for an unexpected reason, e.g., drift of the reticle stage RS, during exposure of one shot region, despite the servo control of the reticle stage RS or the wafer stage 210 performed by the second alignment optical system. According to the invention, it is possible to obviate this problem when a control is made to finely adjust the position of the reticle stage RS or the wafer stage 210 in accordance with the amount of misalignment determined by the first alignment optical system during each shot of exposure, thus enabling the exposure at a further enhanced accuracy of superposition.

When such a control is employed, the main control device 250 operates to update the reference value for the servo control of the reticle stage RS or the wafer stage 210 in conformity with the output value of the second alignment optical system obtained when the amount of misregistration as determined by the first alignment optical system has been reduced substantially to zero. Then, the servo control of the reticle stage RS or the wafer stage 210 is executed by employing the second alignment optical system on the basis of this new reference value.

The arrangement also may be such that the above-mentioned reference value is updated directly in accordance with the amount of misalignment detected by the first alignment optical system, followed by the described servo control of the reticle stage RS or the wafer stage 210 by the use of the second alignment optical system.

What is claimed is:

1. A projection exposure apparatus having an irradiation optical system for irradiating a pattern formed on a mask with first irradiation light, a projection optical system for imaging and projecting the image of said pattern of said mask onto a photosensitive substrate, and mark detection means for irradiating a predetermined mark formed on said photosensitive substrate with second irradiation light in a wavelength region which is different from that of said first irradiation light by said projection optical system and detecting light generated from said mark, said projection exposure apparatus comprising:

a deflection member disposed on a pupil surface of said projection optical system or in a periphery in an adjacent plane of the same, shielding a beam, which is a portion of said first irradiation light generated from said mask and incident on said projection optical system, and which passes through the peripheral portion of said pupil surface of said projection optical system, deflecting said second irradiation light by a predetermined quantity and passing said deflected second irradiation light, wherein said mark detection means includes an irradiation system for emitting said second irradiation light to travel toward said deflection member.

2. A projection exposure apparatus according to claim 1, wherein said deflection member deflects said second irradiation light in a radial direction relative to the optical axis of said projection optical system.

3. A projection exposure apparatus according to claim 1, wherein said deflection member has a first deflection device for deflecting said second irradiation light with which said photosensitive substrate is irradiated and a second deflection device for deflecting light generated from said mark by a predetermined quantity, and said mark detection means has a photoelectric detector for detecting light reflected by said second deflection device.

4. A projection exposure apparatus according to claim 3, wherein said first deflection device and said second deflection device are disposed to face each other while holding the optical axis of said projection optical system therebetween.

5. A projection exposure apparatus according to claim 1, wherein said deflection member is a diffraction grating shape pattern formed on a substantially transparent substrate with respect to said first irradiation light and said second irradiation light.

6. A projection exposure apparatus according to claim 5, wherein said diffraction grating pattern is formed on a surface of said transparent substrate adjacent to said photosensitive substrate and the surface of said transparent substrate adjacent to said mask has a thin film having a wavelength selectivity for shielding said first irradiation light, which passes through a peripheral portion of said pupil surface of said projection optical system, said thin film being formed into an annular shape.

7. A projection exposure apparatus according to claim 1, wherein said irradiation system emits two light beams to be incident on said diffraction grating mark on said photosensitive substrate from different directions, said two light beams being emitted as said second irradiation light.

8. A projection exposure apparatus having an irradiation optical system for irradiating a pattern formed on a mask with first irradiation light, a projection optical system for imaging and projecting the image of said pattern of said mask onto a photosensitive substrate, and mark detection means for irradiating a predetermined mark formed on said photosensitive substrate with second irradiation light in a wavelength region which is different from that of said first irradiation light by said projection optical system and detecting light generated from said mark, said projection exposure apparatus comprising:

an irradiation system for emitting said second irradiation light and included by said mark detection means in such a manner that said second irradiation light passes through a peripheral portion of said pupil surface of said projection optical system; and a deflection member disposed between said irradiation system and said photosensitive substrate, deflecting, by a predetermined quantity, said second irradiation light traveling toward said photosensitive substrate and passing said second irradiation light.

9. A projection exposure apparatus having an irradiation optical system for irradiating a pattern formed on a mask with first irradiation light, a projection optical system for imaging and projecting the image of said pattern of said mask onto a photosensitive substrate, and mark detection means for irradiating a predetermined mark formed on said photosensitive substrate with second irradiation light in a wavelength region which is different from that of said first irradiation light by said projection optical system and detecting light generated from said mark, said projection exposure apparatus comprising:

a deflection member disposed between said irradiation system and said photosensitive substrate, deflecting, by a predetermined quantity, said second irradiation light traveling toward said photosensitive substrate and passing said second irradiation light; and a protection member for shielding or reducing the quantity of a light beam of said first irradiation light which is generated from said mask, said light beam being incident on said deflection member.

10. A projection exposure apparatus according to claim 9, wherein said protection member is a light shielding layer or a light-quantity reducing layer fastened to cover a substantially transparent substrate with respect to said first irradiation light, and said transparent substrate is disposed in a plane which is substantially conjugate with said deflection member in said irradiation optical system.

11. A projection exposure apparatus according to claim 9, wherein said deflection member is a diffraction grating shape pattern formed on a substantially transparent substrate with respect to said first irradiation light and said second irradiation light.

12. A projection exposure apparatus according to claim 11, wherein said transparent substrate is disposed on a pupil surface of said projection optical system or in a periphery in an adjacent plane of the same.

13. A projection exposure apparatus according to claim 11, wherein said diffraction grating shape pattern is formed on the surface of said transparent substrate adjacent to said photosensitive substrate, and said protection member is a light shielding layer or a light-quantity reducing layer fastened to cover the surface of said transparent substrate on which said diffraction grating shape pattern is formed.

14. A projection exposure apparatus according to claim 9, wherein said irradiation optical system is disposed on a Fourier transformed surface with respect to said pattern of said mask or in its the adjacent surface and has an aperture diaphragm capable of adjusting the light quantity distribution of said first irradiation light, and said aperture diaphragm makes the light quantity of said first irradiation light, which passes through a portion adjacent to the optical axis of said irradiation optical system, to be zero.

15. A projection exposure apparatus according to claim 14, wherein said deflection member is disposed on the pupil surface of said projection optical system or in a peripheral portion of its adjacent surface, and said mark detection means has an irradiation system for emitting said second irradiation light toward said deflection member.

16. A projection exposure apparatus having an irradiation optical system for irradiating a pattern formed on a mask with first irradiation light and a projection optical system for imaging and projecting the image of said pattern of said mask onto a photosensitive substrate, said projection exposure apparatus comprising:

first-mark detection means for irradiating first mark formed on said mask and a second mark formed on said photosensitive substrate by means of said projection optical system with irradiation light in substantially the same wavelength region as that of said first irradiation light and as well as detecting light generated from each of said first mark and said second mark;

second-mark detection means for irradiating a third mark formed on said photosensitive substrate while holding a predetermined positional relationship with said second mark and as well as detecting light generated from said third mark;

drive means for relatively moving said mask and said photosensitive substrate in a plane substantially perpendicular to the optical axis of said projection optical system; and control means for controlling said drive means so as to make the quantity of a relative misalignment between said mask and said photosensitive substrate to be substantially zero in accordance with a detection signal supplied from said first-mark detection means, wherein said control means controls said drive means in accordance with the change in a detection signal supplied from said second-mark detection means during a period in which said pattern of said mask is being exposed to said photosensitive substrate.

17. A projection exposure apparatus according to claim 16, wherein said second-mark detection means has an irradiation system for emitting said second irradiation light, and a deflection member disposed between said irradiation system and said photosensitive substrate, deflecting said second irradiation light by a predetermined quantity and passing said second irradiation light so as to cause second irradiation light to travel toward said third mark by means of said projection optical system.

18. A projection exposure apparatus according to claim 17, wherein said deflection member is disposed on a plane in said projection optical system which becomes a Fourier transform surface of said pattern of said mask or in its adjacent plane.

19. A projection exposure apparatus according to claim 18, wherein said deflection member is a diffraction grating shape pattern formed on a substantially transparent substrate with respect to each of said first irradiation light and said second irradiation light.

20. A projection exposure apparatus according to claim 19, wherein said diffraction grating shape pattern is a phase-type diffraction grating.

21. A projection exposure apparatus according to claim 16, wherein said second mark and said third mark are the same mark.

22. A projection exposure apparatus according to claim 16, wherein said first-mark detection means has an optical integrator.

23. A projection exposure apparatus having an irradiation optical system for irradiating a pattern formed on a mask with first irradiation light and a projection optical system for imaging and projecting the image of said pattern of said mask onto a photosensitive substrate, said projection exposure apparatus comprising:

mark detection means for irradiating a predetermined mark formed on said photosensitive substrate with second irradiation light in a wavelength which is different from said first irradiation light during a period in which said pattern of said mask is being exposed to said photosensitive substrate and as well as detecting light generated from said mark;

drive means for relatively moving said mask and said photosensitive substrate in a plane substantially perpendicular to the optical axis of said projection optical system; and control means for controlling said drive means in accordance with change in a detection signal supplied from said mark detection means.

* * * * *